(12) United States Patent
Kim et al.

(10) Patent No.: US 10,703,946 B2
(45) Date of Patent: Jul. 7, 2020

(54) ADHESIVE DELAMINATION LAYER INCLUDING AT LEAST ONE NON-LINEAR ORGANOPOLYSILOXANE

(71) Applicant: Dow Silicones Corporation, Midland, MI (US)

(72) Inventors: Ginam Kim, Midland, MI (US); Junying Liu, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 91 days.

(21) Appl. No.: 16/091,127

(22) PCT Filed: May 10, 2017

(86) PCT No.: PCT/US2017/031857
§ 371 (c)(1),
(2) Date: Oct. 4, 2018

(87) PCT Pub. No.: WO2017/200807
PCT Pub. Date: Nov. 23, 2017

(65) Prior Publication Data
US 2019/0119538 A1 Apr. 25, 2019

Related U.S. Application Data

(60) Provisional application No. 62/336,780, filed on May 16, 2016.

(51) Int. Cl.
C09J 183/04 (2006.01)
H01L 21/683 (2006.01)
(Continued)

(52) U.S. Cl.
CPC ............ *C09J 183/04* (2013.01); *C08G 77/20* (2013.01); *C08L 83/00* (2013.01); *C09J 5/06* (2013.01);
(Continued)

(58) Field of Classification Search
USPC ........................................................ 156/247
See application file for complete search history.

(56) References Cited

U.S. PATENT DOCUMENTS 4,257,936 A 3/1981 Matsumoto et al.
8,128,773 B2 3/2012 Chun et al.
(Continued)

FOREIGN PATENT DOCUMENTS

GB 2530388 3/2016
JP 20114617 1/2011

OTHER PUBLICATIONS

List of Publications from 1st Office Action dated Oct. 28, 2019 from corresponding Japanese Patent A No. 2018-556290.

*Primary Examiner* — Sing P Chan

(57) ABSTRACT

An adhesive delamination layer including at least one non-linear organopolysiloxane and methods for display device substrate processing are disclosed. The method includes securing the display device substrate to a carrier substrate with an adhesive delamination layer including a cured product of curing a precursor adhesive composition. The precursor adhesive composition includes Component (A), a hydrogenorganopolysiloxane and Component (B), a ($C_2$-$C_{20}$)alkenyl-functionalized organopolysiloxane, wherein the ($C_2$-$C_{20}$)alkenyl group is uninterrupted or interrupted by 1, 2, or 3 groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$- wherein at least one of Component (A) and Component (B) is non-linear.

17 Claims, 2 Drawing Sheets

(51) Int. Cl.
  *C08L 83/00* (2006.01)
  *H01L 27/12* (2006.01)
  *G03F 7/26* (2006.01)
  *G03F 7/20* (2006.01)
  *G03F 7/16* (2006.01)
  *C09J 5/06* (2006.01)
  *C08G 77/20* (2006.01)
  *C08G 77/12* (2006.01)
  *C08G 77/00* (2006.01)
  *C09J 11/00* (2006.01)
  *C08L 83/04* (2006.01)

(52) U.S. Cl.
  CPC .................. *G03F 7/16* (2013.01); *G03F 7/20* (2013.01); *G03F 7/26* (2013.01); *H01L 21/6835* (2013.01); *H01L 27/1266* (2013.01); *C08G 77/12* (2013.01); *C08G 77/70* (2013.01); *H01L 2221/6835* (2013.01)

(56) References Cited

U.S. PATENT DOCUMENTS

| | | |
|---|---|---|
| 2008/0090380 A1 | 4/2008 | Gardner et al. |
| 2008/0135175 A1 | 6/2008 | Higuchi |
| 2012/0156480 A1 | 6/2012 | Kondo et al. |
| 2015/0337189 A1 | 11/2015 | Takanashi et al. |

ADHESIVE DELAMINATION LAYER INCLUDING AT LEAST ONE NON-LINEAR ORGANOPOLYSILOXANE

CROSS-REFERENCE TO RELATED APPLICATIONS

This application is the National Stage of International Application No. PCT/US2017/031857 filed on 10 May 2017, which claims priority to and all advantages of U.S. Provisional Patent Application No. 62/336,780 filed on 16 May 2016, the content of which is hereby incorporated by reference.

TECHNICAL FIELD

This invention generally relates to an adhesive delamination layer including at least one non-linear organopolysiloxane, and related aspects including a method of processing a display device substrate and to a display device processing intermediate.

BACKGROUND OF THE RELATED ART

In the production of display devices such as liquid crystal displays (LCD), light emitting diode (LED) displays, and organic light emitting diode (OLED) displays, a variety of display device components are manufactured from thin display device substrates, including flexible and non-flexible glass and non-glass substrates. It can be challenging to perform manufacturing processes on some thin display device substrates due to their fragile nature, the high degree of precision required during certain manufacturing processes, and due to the harsh conditions of certain manufacturing processes (e.g., high temperatures).

SUMMARY OF THE INVENTION

A method of processing a display device substrate. Embodiments of the method include securing the display device substrate to a carrier substrate with an adhesive delamination layer. The adhesive delamination layer includes a cured product of curing a precursor adhesive composition. The precursor adhesive composition is curable and includes a hydrogenorganopolysiloxane. The precursor adhesive composition also includes a $(C_2-C_{20})$alkenyl-functionalized organopolysiloxane. At least one of the hydrogenorganopolysiloxane and the $(C_2-C_{20})$alkenyl-functionalized organopolysiloxane is non-linear.

A display device processing intermediate. Embodiments of the display device processing intermediate include a carrier substrate and an adhesive delamination layer on the carrier substrate.

BRIEF DESCRIPTION OF THE FIGURES

The drawings illustrate generally, by way of example, but not by way of limitation, various embodiments discussed in the present document.

DETAILED DESCRIPTION OF THE INVENTION

Figure 1:
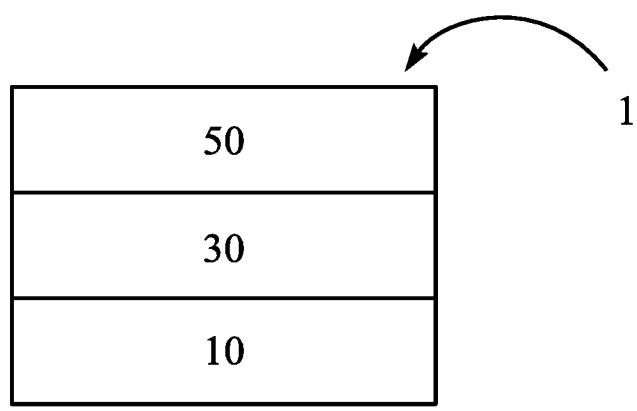
FIG. 1 illustrates a display device processing intermediate, in accordance with various embodiments.

The Brief Summary and Abstract are incorporated here by reference.

The following exemplary embodiments are provided, the numbering of which is not to be construed as designating levels of importance:

Embodiment 1 is a method of processing a display device substrate, the method comprising: securing the display device substrate to a carrier substrate with an adhesive delamination layer comprising a cured product of curing a precursor adhesive composition comprising Component (A), a hydrogenorganopolysiloxane; and Component (B), a $(C_2-C_{20})$alkenyl-functionalized organopolysiloxane, wherein the $(C_2-C_{20})$alkenyl group is uninterrupted or interrupted by 1, 2, or 3 interrupting groups independently chosen from —O—, —S—, substituted or unsubstituted —NH—, —(O—$(C_2-C_3)$alkylene)$_n$- wherein n is 1 to 1,000, —Si(($C_1-C_5$)alkoxy)$_2$-, and —Si(($C_1-C_5$)alkyl)$_2$-; wherein at least one of Component (A) and Component (B) is non-linear.

Embodiment 2 is the method of Embodiment 1, wherein the display device substrate comprises glass, silicon, ceramic, plastic, metal, or a combination thereof.

Embodiment 3 is the method of any one of Embodiments 1-2, wherein the display device substrate comprises a processing precursor component of at least one of a light-emitting diode display (LED), an electroluminescent display (ELD), an electronic paper display, a plasma display panel (PDP), a liquid crystal display (LCD), a high-performance addressing display (HPA), thin-film transistor display (TFT), organic light-emitting diode display (OLED), surface-conduction electron-emitter display (SED), a laser TV display, a carbon nanotubes display, a quantum dot display, and an interferometric modulator display (IMOD).

Embodiment 4 is the method of any one of Embodiments 1-3, wherein the display device substrate has a thickness of 1 nm to 5 mm.

Embodiment 5 is the method of any one of Embodiments 1-4, wherein the display device substrate has a thickness of 1 nm to 0.5 mm.

Embodiment 6 is the method of any one of Embodiments 1-5, wherein the carrier substrate comprises glass, silicon, ceramic, plastic, metal, or a combination thereof.

Embodiment 7 is the method of any one of Embodiments 1-6, wherein Component (A) is non-linear and Component (B) is linear.

Embodiment 8 is the method of any one of Embodiments 1-6, wherein Component (A) is linear and Component (B) is non-linear.

Embodiment 9 is the method of any one of Embodiments 1-6, wherein Component (A) is non-linear and Component (B) is non-linear.

Embodiment 10 is the method of any one of Embodiments 1-9, wherein 0.1 wt % to 99.9 wt % of the precursor adhesive composition is Component (A) and wherein 0.1 wt % to 99.9 wt % of the precursor adhesive composition is Component (B). With the proviso that in the precursor adhesive composition comprising Components (A) and (B), the total amount of Components (A) and (B) is from 50 wt % to <100 wt %.

Embodiment 11 is the method of any one of Embodiments 1-10, wherein 0.2 wt % to 40 wt % of the precursor adhesive composition is Component (A) and wherein 0.2 wt % to 40 wt % of the precursor adhesive composition is Component (B). With the proviso that in the precursor adhesive composition comprising Components (A) and (B), the total amount of Components (A) and (B) is from 50 wt % to 99 wt %.

Embodiment 12 is the method of any one of Embodiments 1-6, 10, and 11, wherein Component (A) is non-linear.

Embodiment 13 is the method of Embodiment 12, wherein Component (A) is of formula: $(R^A{}_3SiO_{1/2})_w(R^A{}_2SiO_{2/2})_x(R^ASiO_{3/2})_y(SiO_{4/2})_z$, wherein at each occurrence, $R^A$ is independently selected from —H and —$R^1$, at least one $R^A$ in Component (A) is —H, at each occurrence $R^1$ is independently a substituted or unsubstituted $(C_1$-$C_{20})$hydrocarbyl uninterrupted or interrupted with 1, 2, or 3 interrupting groups chosen from —O—, —S—, substituted or unsubstituted —NH—, —Si(($C_1$-$C_5$)alkoxy)$_2$-, and —Si(($C_1$-$C_5$)alkyl)$_2$-, subscripts y and z are independently 0 to 5,000, at least one of y and z is greater than 0, and subscript w is 0 to 500 and subscript x is 0 to 5,000.

Embodiment 14 is the method of Embodiment 13, wherein $R^1$ is a $(C_1$-$C_{20})$hydrocarbyl.

Embodiment 15 is the method of any one of Embodiments 13-14, wherein $R^1$ is a $(C_1$-$C_5)$alkyl.

Embodiment 16 is the method of any one of Embodiments 13-15, wherein $R^1$ is methyl.

Embodiment 17 is the method of any one of Embodiments 13-16, wherein Component (A) is of formula: $(HMe_2SiO_{1/2})_{1.58}(SiO_{4/2})$, wherein the unit subscripts indicate mole ratios thereof.

Embodiment 18 is the method of any one of Embodiments 1-6, 10, and 11, wherein Component (A) is linear.

Embodiment 19 is the method of Embodiment 18, wherein Component (A) is of formula: $(R^A{}_3SiO_{1/2})_2(R^A{}_2SiO_{2/2})_x$, wherein at each occurrence, $R^A$ is independently selected from —H and —$R^1$, at least one $R^A$ in Component (A) is —H, at each occurrence $R^1$ is independently a substituted or unsubstituted $(C_1$-$C_{20})$hydrocarbyl uninterrupted or interrupted with 1, 2, or 3 interrupting groups chosen from —O—, —S—, substituted or unsubstituted —NH—, —Si(($C_1$-$C_5$)alkoxy)$_2$-, and —Si(($C_1$-$C_5$)alkyl)$_2$-, subscript x is 0 to 5,000.

Embodiment 20 is the method of Embodiment 19, wherein $R^1$ is a $(C_1$-$C_{20})$hydrocarbyl.

Embodiment 21 is the method of any one of Embodiments 19-20, wherein $R^1$ is a $(C_1$-$C_5)$alkyl.

Embodiment 22 is the method of any one of Embodiments 19-21, wherein $R^1$ is methyl.

Embodiment 23 is the method of any one of Embodiments 19-22, wherein subscript x is 1 to 200.

Embodiment 24 is the method of any one of Embodiments 19-23, wherein Component (A) is of formula: $(Me_3SiO_{1/2})_2(Me_2SiO_{2/2})_x(HMeSiO_{2/2})_x$, or $(HMe_2SiO_{1/2})_2(Me_2SiO_{2/2})_x$, wherein subscript x is from 0 to 2000.

Embodiment 25 is the method of any one of Embodiments 19-24, wherein Component (A) is of formula: $(Me_3SiO_{1/2})_2(Me_2SiO_{2/2})_{3-4}(HMeSiO_{2/2})_{5-6}$, or $(HMe_2SiO_{1/2})_2(Me_2SiO_{2/2})_{100}$.

Embodiment 26 is the method of any one of Embodiments 1-25, wherein 1 wt % to 99.9 wt % of the precursor adhesive composition is Component (B).

Embodiment 27 is the method of any one of Embodiments 1-26, wherein 40 wt % to 99.9 wt % of the precursor adhesive composition is Component (B).

Embodiment 28 is the method of any one of Embodiments 1-6 and 10-27, wherein Component (B) is non-linear.

Embodiment 29 is the method of Embodiment 28, wherein Component (B) is of formula: $(R^B{}_3SiO_{1/2})_w(R^B{}_2SiO_{2/2})_x(R^BSiO_{3/2})_y(SiO_{4/2})_z$, wherein at each occurrence, $R^B$ is independently selected from $R^1$ and $R^2$, at least one $R^B$ is $R^2$, at each occurrence $R^1$ is independently a substituted or unsubstituted $(C_1$-$C_{20})$hydrocarbyl uninterrupted or interrupted with 1, 2, or 3 interrupting groups chosen from —O—, —S—, substituted or unsubstituted —NH—, —Si(($C_1$-$C_5$)alkoxy)$_2$-, and —Si(($C_1$-$C_5$)alkyl)$_2$-, at each occurrence $R^2$ is independently a substituted or unsubstituted $(C_2$-$C_{20})$alkenyl uninterrupted or interrupted with 1, 2, or 3 interrupting groups chosen from —O—, —S—, substituted or unsubstituted —NH—, —(O—($C_2$-$C_3$)alkylene)$_n$- wherein subscript n is 1 to 1,000, —Si(($C_1$-$C_5$)alkoxy)$_2$-, and —Si(($C_1$-$C_5$)alkyl)$_2$-, subscripts y and z are independently 0 to 5,000, at least one of y and z is greater than 0, and subscript w is 0 to 500 and subscript x is 0 to 5,000.

Embodiment 30 is the method of Embodiment 29, wherein $R^1$ is a $(C_1$-$C_{20})$hydrocarbyl.

Embodiment 31 is the method of any one of Embodiments 29-30, wherein $R^1$ is a $(C_1$-$C_5)$alkyl.

Embodiment 32 is the method of any one of Embodiments 29-31, wherein $R^1$ is methyl.

Embodiment 33 is the method of any one of Embodiments 29-32, wherein $R^2$ is a $(C_2$-$C_{20})$alkenyl.

Embodiment 34 is the method of any one of Embodiments 29-33, wherein $R^2$ is a vinyl group.

Embodiment 35 is the method of any one of Embodiments 29-34, wherein Component (B) is of formula $(ViMe_2SiO_{1/2})_w(Me_2SiO_{2/2})_x(SiO_{4/2})_z$, wherein subscript w is 0 to 500 and subscripts x and z are independently 1 to 5,000.

Embodiment 36 is the method of Embodiment 35, wherein w, x, and z are independently 1 to 150.

Embodiment 37 is the method of any one of Embodiments 29-36, wherein Component (B) is of formula $(ViMe_2SiO_{1/2})_{2-8}(Me_2SiO_{2/2})_{60-180}(SiO_{4/2})_{1-2}$ or $(ViMe_2SiO_{1/2})_{5-20}(Me_3SiO_{1/2})_{10-50}(Si_{4/2})_{20-80}$.

Embodiment 38 is the method of any one of Embodiments 29-37, wherein Component (B) is of formula $(ViMe_2SiO_{1/2})_4(Me_2SiO_{2/2})_{120}(SiO_{4/2})$ or $(ViMe_2SiO_{1/2})_{11}(Me_3SiO_{1/2})_{34}(SiO_{4/2})_{55}$.

Embodiment 39 is the method of any one of Embodiments 1-6 and 10-27, wherein Component (B) is linear.

Embodiment 40 is the method of Embodiment 39, wherein Component (B) is of formula: $(R^B{}_3SiO_{1/2})_2(R^B{}_2SiO_{2/2})_x$, wherein at each occurrence, $R^B$ is independently selected from —$R^1$ and —$R^2$, at least one $R^B$ is $R^2$, at each occurrence $R^1$ is independently a substituted or unsubstituted $(C_1$-$C_{20})$hydrocarbyl uninterrupted or interrupted with 1, 2, or 3 interrupting groups chosen from —O—, —S—, substituted or unsubstituted —NH—, —Si(($C_1$-$C_5$)alkoxy)$_2$-, and —Si(($C_1$-$C_5$)alkyl)$_2$-, at each occurrence $R^2$ is independently a substituted or unsubstituted $(C_2$-$C_{20})$alkenyl uninterrupted or interrupted with 1, 2, or 3 interrupting groups chosen from —O—, —S—, substituted or unsubstituted —NH—, —(O—($C_2$-$C_3$)alkylene)$_n$- wherein subscript n is 1 to 1,000, —Si(($C_1$-$C_5$)alkoxy)$_2$-, and —Si(($C_1$-$C_5$)alkyl)$_2$-, and subscript x is 0 to 5,000.

Embodiment 41 is the method of Embodiment 40, wherein $R^1$ is a $(C_1$-$C_{20})$hydrocarbyl.

Embodiment 42 is the method of any one of Embodiments 40-41, wherein $R^1$ is a $(C_1$-$C_5)$alkyl.

Embodiment 43 is the method of any one of Embodiments 40-42, wherein $R^1$ is methyl.

Embodiment 44 is the method of any one of Embodiments 40-43, wherein $R^2$ is a $(C_2$-$C_{20})$alkenyl.

Embodiment 45 is the method of any one of Embodiments 40-44, wherein $R^2$ is a vinyl group.

Embodiment 46 is the method of any one of Embodiments 40-45, wherein Component (B) is $(ViMe_2SiO_{1/2})_2(Me_2SiO_{2/2})_{50-300}$.

Embodiment 47 is the method of any one of Embodiments 40-46, wherein Component (B) is $(ViMe_2SiO_{1/2})_2(Me_2SiO_{2/2})_{150}$.

Embodiment 48 is the method of any one of Embodiments 1-47, wherein Component (A) is chosen from $(HR^1{}_2SiO_{1/2})_2(R^1{}_2SiO_{2/2})_{1-2000}$; alternatively from $(HR^1{}_2SiO_{1/2})_{m1}(R^1{}_3SiO_{1/2})_{m2}(HR^1SiO_{2/2})_{d1}(R^1{}_2SiO_{2/2})_{d2}(R^1SiO_{3/2})_{t1}(HSiO_{3/2})_{t2}(SiO_{4/2})_{q1}$; wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, alternatively 0 to 0.3, m2 is from 0 to 0.8, alternatively 0 to 0.3, d1 is 0 to 0.999, alternatively from 0 to 0.99, d2 is from 0 to 0.9999, alternatively from 0 to 0.999, t1 is from 0 to 0.8, t2 is from 0 to 0.8, and q1 is from 0 to 0.99. At each occurrence $R^1$ is independently a substituted or unsubstituted $(C_1$-$C_{20})$hydrocarbyl uninterrupted or interrupted with 1, 2, or 3 interrupting groups chosen from —O—, —S—, substituted or unsubstituted —NH—, —Si$((C_1$-$C_5)$alkoxy$)_2$-, and —Si$((C_1$-$C_5)$alkyl$)_2$-. The Component (A) may be linear, alternatively non-linear.

Embodiment 49 is the method of any one of Embodiments 1-48, wherein Component (A) is chosen from $(Me_3SiO_{1/2})_2(Me_2SiO_{2/2})_{1-2000}(HMeSiO_{2/2})_{1-2000}$, $(HMe_2SiO_{1/2})_{0.1-20}(SiO_{4/2})_{0.1-5}$ wherein the unit subscripts indicate mole ratios thereof, and $(HMe_2SiO_{1/2})_2(Me_2SiO_{2/2})_{1-2000}$. The Component (A) may be linear.

Embodiment 50 is the method of any one of Embodiments 1-49, wherein Component (A) is chosen from $(Me_3SiO_{1/2})_2(Me_2SiO_{2/2})_{3-4}(HMeSiO_{2/2})_{5-6}$, $(HMe_2SiO_{1/2})_{1-3}(SiO_{4/2})$ wherein the unit subscripts indicate mole ratios thereof, and $(HMe_2SiO_{1/2})_2(Me_2SiO_{2/2})_{100}$. The Component (A) may be non-linear.

Embodiment 51 is the method of any one of Embodiments 1-50, wherein Component (B) is chosen from $(R^2R^1{}_2SiO_{1/2})_2(Me_2SiO_{2/2})_{1-2000}$; alternatively from $(R^2R^1{}_2SiO_{1/2})_{m1}(R^1{}_3SiO_{1/2})_{m2}(R^2R^1SiO_{2/2})_{d1}(R^1{}_2SiO_{2/2})_{d2}(R^1SiO_{3/2})_{t1}(R^2SiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, alternatively 0 to 0.3, m2 is from 0 to 0.8, alternatively 0 to 0.3, d1 is 0 to 0.9999, alternatively from 0 to 0.999, d2 is from 0 to 0.9999, alternatively from 0 to 0.999, t1 is from 0 to 0.8, t2 is from 0 to 0.8, and q1 is from 0 to 0.99. At each occurrence $R^1$ is independently a substituted or unsubstituted $(C_1$-$C_{20})$ hydrocarbyl uninterrupted or interrupted with 1, 2, or 3 interrupting groups chosen from —O—, —S—, substituted or unsubstituted —NH—, —Si$((C_1$-$C_5)$alkoxy$)_2$-, and —Si$((C_1$-$C_5)$alkyl$)_2$-, and at each occurrence $R^2$ is independently a substituted or unsubstituted $(C_2$-$C_{20})$alkenyl uninterrupted or interrupted with 1, 2, or 3 interrupting groups chosen from —O—, —S—, substituted or unsubstituted —NH—, —(O—$(C_2$-$C_3)$alkylene$)_n$- wherein n is 1 to 1,000, —Si$((C_1$-$C_5)$alkoxy$)_2$-, and —Si$((C_1$-$C_5)$alkyl$)_2$-. The Component (B) may be linear, alternatively non-linear.

Embodiment 52 is the method of any one of Embodiments 1-51, wherein Component (B) is chosen from $(ViMe_2SiO_{1/2})_{1-100}(Me_2SiO_{2/2})_{50-200}(SiO_{4/2})_{1-5}$, $(ViMe_2SiO_{1/2})_2(Me_2SiO_{2/2})_{1-2000}$, and $(ViMe_2SiO_{1/2})_{1-100}(Me_3SiO_{1/2})_{1-100}(SiO_{4/2})_{1-200}$. The Component (B) may be non-linear.

Embodiment 53 is the method of any one of Embodiments 1-52, wherein Component (B) is chosen from $(ViMe_2SiO_{1/2})_4(Me_2SiO_{2/2})_{120}(SiO_{4/2})$, $(ViMe_2SiO_{1/2})_2(Me_2SiO_{2/2})_{150}$, and $(ViMe_2SiO_{1/2})_{11}(Me_3SiO_{1/2})_{34}(SiO_{4/2})_{55}$. The Component (B) may be non-linear (a Q-branched polymer).

Embodiment 54 is the method of any one of Embodiments 1-53, wherein Component (A) is of formula: $(Me_3SiO_{1/2})_2(Me_2SiO_{2/2})_{1-6}(HMeSiO_{2/2})_{3-9}$, and Component (B) is of formula: $(ViMe_2SiO_{1/2})_{2-8}(Me_2SiO_{2/2})_{50-200}(SiO_{4/2})_{1-2}$. The Component (A) may be linear and the Component (B) may be non-linear.

Embodiment 55 is the method of any one of Embodiments 1-54, wherein Component (A) is of formula: $(Me_3SiO_{1/2})_2(Me_2SiO_{2/2})_{3-4}(HMeSiO_{2/2})_{5-6}$, and Component (B) is of formula: $(ViMe_2SiO_{1/2})_4(Me_2SiO_{2/2})_{120}(SiO_{4/2})$. The Component (A) may be linear and the Component (B) may be non-linear.

Embodiment 56 is the method of any one of Embodiments 1-55, wherein Component (A) is of formula: $(HMe_2SiO_{1/2})_{1-3}(SiO_{4/2})$ wherein the unit subscripts indicate mole ratios thereof, and Component (B) is of formula: $(ViMe_2SiO_{1/2})_2(Me_2SiO_{2/2})_{50-300}$. The Component (A) may be non-linear and the Component (B) may be non-linear.

Embodiment 57 is the method of any one of Embodiments 1-56, wherein Component (A) is of formula: $(HMe_2SiO_{1/2})_{1.58}(SiO_{4/2})$ wherein the unit subscripts indicate mole ratios thereof, and Component (B) is of formula: $(ViMe_2SiO_{1/2})_2(Me_2SiO_{2/2})_{150}$. The Component (A) may be non-linear and the Component (B) may be linear.

Embodiment 58 is the method of any one of Embodiments 1-57, wherein Component (A) is of formula: $(HMe_2SiO_{1/2})_2(Me_2SiO_{2/2})_{50-300}$, and Component (B) is of formula: $(ViMe_2SiO_{1/2})_{5-20}(Me_3SiO_{1/2})_{10-50}(SiO_{4/2})_{20-80}$. The Component (A) may be linear and the Component (B) may be non-linear.

Embodiment 59 is the method of any one of Embodiments 1-58, wherein Component (A) is of formula: $(HMe_2SiO_{1/2})_2(Me_2SiO_{2/2})_{100}$, and Component (B) is of formula: $(ViMe_2SiO_{1/2})_{11}(Me_3SiO_{1/2})_{34}(SiO_{4/2})_{55}$. The Component (A) may be linear and the Component (B) may be non-linear.

Embodiment 60 is the method of any one of Embodiments 1-59, wherein the precursor adhesive composition further comprises at least one of a thermoplastic material, a thermoset material, a monomer, an oligomer, a polymer, a crosslinkable polymer, a crosslinked polymer, a rubber, a polyurethane, a polyisobutylene, a silane, an organosilane, a siloxane, an organosiloxane, a fluorosilicone, a fluorosilane, a shellac, a polyamide, a silyl-modified polyamide, a polyester, a polycarbonate, a polycarbamate, a urethane, a natural adhesive, an epoxy-based adhesive, a furan-based adhesive, a phenolic-based adhesive, an aldehyde-based adhesive, a urea-aldehyde adhesive, an acrylic acid-based adhesive, a phenol/phenol formaldehyde/furfuryl alcohol adhesive, a curing agent, a catalyst, a precursor that is curable to form of any one of the same, and a reaction product of any one of the same.

Embodiment 61 is the method of any one of Embodiments 1-60, wherein the precursor adhesive composition further comprises at least one of an organohydrogensilane, an organohydrogensiloxane, an organoalkenylsilane, and an organoalkenylsiloxane.

Embodiment 62 is the method of any one of Embodiments 1-61, wherein the precursor adhesive composition further comprises at least one of a non-linear $(C_2$-$C_{20})$alkenyl-functionalized organopolysiloxane, a linear $(C_2$-$C_{20})$alkenyl-functionalized organopolysiloxane, a linear $(C_2$-$C_{20})$ alkenyl-functionalized fluoro$(C_1$-$C_{20})$alkyl-substituted organopolysiloxane, a non-linear hydrogenorganopolysiloxane, a linear hydrogenorganopolysiloxane, and a ((C$_1$-C$_{20}$)hydrocarbyphydrogensilsesquioxane, wherein the (C$_2$-C$_{20}$)alkenyl group and (C$_1$-C$_{20}$)hydrocarbyl are independently selected, substituted or unsubstituted, and are uninterrupted or interrupted with 1, 2, or 3 interrupting groups independently chosen from —O—, —S—, substituted or unsubstituted —NH—, —(O—(C$_2$-C$_3$)alkylene)$_n$- wherein subscript n is 1 to 1,000, —Si((C$_1$-C$_5$)alkoxy)$_2$-, and —Si((C$_1$-C$_5$)alkyl)$_2$-.

Embodiment 63 is the method of any one of Embodiments 1-62, wherein the precursor adhesive composition further comprises at least one of (R$^2$R$^1{}_2$SiO$_{1/2}$)$_{1-20}$(R$^1{}_2$SiO$_{2/2}$)$_{10-300}$(SiO$_{4/2}$)$_{1-5}$, (R$^2$R$^1{}_2$SiO$_{1/2}$)$_{1-100}$(R$^1{}_2$SiO$_{2/2}$)$_{1-200}$(SiO$_{4/2}$)$_{1-500}$, (R$^2$R$^1{}_2$SiO$_{1/2}$)$_2$(R$^1{}_2$SiO$_{2/2}$)$_{10-2000}$, (R$^2$R$^1{}_2$SiO$_{1/2}$)$_2$(R$^f$R$^1$SiO$_{2/2}$)$_{10-5000}$(R$^1{}_2$SiO$_{2/2}$)$_{10-5000}$(R$^2$R$^1$SiO$_{2/2}$)$_{1-100}$, (R$^2$R$^1{}_2$SiO$_{1/2}$)$_2$(R$^1{}_2$SiO$_{2/2}$)$_{100-5000}$, (R$^1{}_3$SiO$_{1/2}$)$_2$(R$^1{}_2$SiO$_{2/2}$)$_{1-100}$(HR$^1$SiO$_{2/2}$)$_{1-200}$, (HR$^1{}_2$SiO$_{1/2}$)$_{0.1-10}$(SiO$_{4/2}$)$_{0.1-5}$ wherein the unit subscripts indicate mole ratios thereof, (R$^1{}_3$SiO$_{1/2}$)$_2$(R$^f$R$^1$SiO$_{2/2}$)$_{1-100}$(HR$^1$SiO$_{2/2}$)$_{1-200}$, (HR$^1{}_2$SiO$_{1/2}$)$_2$(R$^1{}_2$SiO$_{2/2}$)$_{10-2000}$, and (HSiO$_{3/2}$)$_{0.001-1}$(R$^1$SiO$_{3/2}$)$_{1.5-0.1}$ wherein the unit subscripts indicate mole ratios thereof, wherein at each occurrence R$^1$ is independently a substituted or unsubstituted (C$_1$-C$_{20}$)hydrocarbyl uninterrupted or interrupted with 1, 2, or 3 interrupting groups chosen from —O—, —S—, substituted or unsubstituted —NH—, —Si((C$_1$-C$_5$)alkoxy)$_2$-, and —Si((C$_1$-C$_5$)alkyl)$_2$-, at each occurrence R$^2$ is independently a substituted or unsubstituted (C$_2$-C$_{20}$)alkenyl uninterrupted or interrupted with 1, 2, or 3 interrupting groups chosen from —O—, —S—, substituted or unsubstituted —NH—, —(O—(C$_2$-C$_3$)alkylene)$_n$- wherein subscript n is 1 to 1,000, —Si((C$_1$-C$_5$)alkoxy)$_2$-, and —Si((C$_1$-C$_5$)alkyl)$_2$-, and at each occurrence R$^f$ is independently a fluoro(C$_m$)alkyl that is otherwise unsubstituted or is further substituted and has 1 to 2m+1 fluorine groups wherein m is independently 1 to 20, wherein the (C$_m$)alkyl group is uninterrupted or interrupted with 1, 2, or 3 interrupting groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-.

Embodiment 64 is the method of any one of Embodiments 1-63, wherein the precursor adhesive composition further comprises at least one of (R$^2$R$^1{}_2$SiO$_{1/2}$)$_{1-8}$(R$^1{}_2$SiO$_{2/2}$)$_{60-180}$(SiO$_{4/2}$)$_{1-2}$, (R$^2$R$^1{}_2$SiO$_{1/2}$)$_{5-20}$(R$^1{}_2$SiO$_{2/2}$)$_{16-56}$(SiO$_{4/2}$)$_{25-85}$, (R$^2$R$^1{}_2$SiO$_{1/2}$)$_2$(R$^1{}_2$SiO$_{2/2}$)$_{75-225}$, (R$^2$R$^1{}_2$SiO$_{1/2}$)$_2$(R$^f$R$^1$SiO$_{2/2}$)$_{100-800}$(R$^1{}_2$SiO$_{2/2}$)$_{400-2000}$(R$^2$R$^1$SiO$_{2/2}$)$_{2-30}$, (R$^2$R$^1{}_2$SiO$_{1/2}$)$_2$(R$^1{}_2$SiO$_{2/2}$)$_{400-1200}$, (R$^1{}_3$SiO$_{1/2}$)$_2$(R$^1{}_2$SiO$_{2/2}$)$_{1-6}$(HR$^1$SiO$_{2/2}$)$_{3-9}$, (HR$^1{}_2$SiO$_{1/2}$)$_{1-2}$(SiO$_{4/2}$)$_{0.5-1.5}$ wherein the unit subscripts indicate mole ratios thereof, (R$^1{}_3$SiO$_{1/2}$)$_2$(R$^f$R$^1$SiO$_{2/2}$)$_{2-40}$(HR$^1$SiO$_{2/2}$)$_{5-80}$, (HR$^1{}_2$SiO$_{1/2}$)$_2$(R$^1{}_2$SiO$_{2/2}$)$_{50-200}$, (R$^1{}_3$SiO$_{1/2}$)$_2$(R$^1{}_2$SiO$_{2/2}$)$_{2-40}$(HR$^1$SiO$_{2/2}$)$_{5-80}$, and (HSiO$_{3/2}$)$_{0.001-1}$(R$^1$SiO$_{3/2}$)$_{1.5-0.1}$ wherein the unit subscripts indicate mole ratios thereof, wherein at each occurrence R$^1$ is independently a substituted or unsubstituted (C$_1$-C$_{20}$)hydrocarbyl uninterrupted or interrupted with 1, 2, or 3 interrupting groups chosen from —O—, —S—, substituted or unsubstituted —NH—, —Si((C$_1$-C$_5$)alkoxy)$_2$-, and —Si((C$_1$-C$_5$)alkyl)$_2$-, at each occurrence R$^2$ is independently a substituted or unsubstituted (C$_2$-C$_{20}$)alkenyl uninterrupted or interrupted with 1, 2, or 3 interrupting groups chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-, and at each occurrence R$^f$ is independently a fluoro(C$_m$)alkyl that is otherwise unsubstituted or is further substituted and has 1 to 2m+1 fluorine groups wherein m is independently 1 to 20, wherein the (C$_m$)alkyl group is uninterrupted or interrupted with 1, 2, or 3 interrupting groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-.

Embodiment 65 is the method of any one of Embodiments 1-64, wherein the precursor adhesive composition further comprises at least one of (R$^2$R$^1{}_2$SiO$_{1/2}$)$_4$(R$^1{}_2$SiO$_{2/2}$)$_{120}$(SiO$_{4/2}$), (R$^2$R$^1{}_2$SiO$_{1/2}$)$_{11}$(R$^1{}_2$SiO$_{2/2}$)$_{34}$(SiO$_2$)$_{55}$, (R$^2$R$^1{}_2$SiO$_{1/2}$)$_2$(R$^1{}_2$SiO$_{2/2}$)$_{150}$, (R$^2$R$^1{}_2$SiO$_{1/2}$)(R$^f$R$^1$SiO$_{2/2}$)$_{300-600}$(R$^1{}_2$SiO$_{2/2}$)$_{800-1000}$(R$^2$R$^1$SiO$_{2/2}$)$_{5-15}$, (R$^2$R$^1{}_2$SiO$_{1/2}$)$_2$(R$^1{}_2$SiO$_{2/2}$)$_{600}$, (R$^1{}_3$SiO$_{1/2}$)$_2$(R$^1{}_2$SiO$_{2/2}$)$_{3-4}$(HR$^1$SiO$_{2/2}$)$_{5-6}$, (HR$^1{}_2$SiO$_{1/2}$)$_{1.58}$(SiO$_{4/2}$) wherein the unit subscripts indicate mole ratios thereof, (R$^1{}_3$SiO$_{1/2}$)$_2$(R$^f$R$^1$SiO$_{2/2}$)$_{5-20}$(HR$^1$SiO$_{2/2}$)$_{10-40}$, (HR$^1{}_2$SiO$_{1/2}$)$_2$(R$^1{}_2$SiO$_{2/2}$)$_{100}$, and (R$^1{}_3$SiO$_{1/2}$)$_2$(R$^1{}_2$SiO$_{2/2}$)$_{5-20}$(HR$^1$SiO$_{2/2}$)$_{10-40}$, and (HSiO$_{3/2}$)$_{0.01-0.5}$(R$^1$SiO$_{3/2}$)$_{1-0.5}$ wherein the unit subscripts indicate mole ratios thereof, wherein at each occurrence R$^1$ is independently a substituted or unsubstituted (C$_1$-C$_{20}$)hydrocarbyl uninterrupted or interrupted with 1, 2, or 3 interrupting groups chosen from —O—, —S—, substituted or unsubstituted —NH—, —Si((C$_1$-C$_5$)alkoxy)$_2$-, and —Si((C$_1$-C$_5$)alkyl)$_2$-, at each occurrence R$^2$ is independently a substituted or unsubstituted (C$_2$-C$_{20}$)alkenyl uninterrupted or interrupted with 1, 2, or 3 interrupting groups chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-, and at each occurrence R$^f$ is independently a fluoro(C$_m$)alkyl that is otherwise unsubstituted or is further substituted and has 1 to 2m+1 fluorine groups wherein m is independently 1 to 20, wherein the (C$_m$)alkyl group is uninterrupted or interrupted with 1, 2, or 3 interrupting groups independently chosen from —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, and —Si((C$_1$-C$_5$)alkyl)$_2$-.

Embodiment 66 is the method of any one of Embodiments 1-65, wherein the precursor adhesive composition further comprises at least one of a non-linear vinyldimethylsiloxy-terminated polydimethylsiloxane, a linear vinyldimethylsiloxy-terminated polydimethylsiloxane, a linear vinyldimethylsiloxy-terminated poly(co-(fluoro(C$_m$)alkypmethylsiloxane-dimethylsiloxane-vinylmethylsiloxane), a linear vinyldimethylsiloxy-terminated polydimethylsiloxane, a linear trimethylsiloxy-terminated poly(co-dimethylsiloxane-hydrogenmethylsiloxane), a hydrogendimethylsiloxy-terminated siloxane, a trimethylsiloxy-terminated poly(co-(fluoro(C$_m$)alkyl)methylsiloxane-dimethylsiloxane), a linear hydrogendimethylsiloxy-terminated dimethylsiloxane, a linear trimethylsiloxy-terminated poly(co-dimethylsiloxane-hydrogenmethylsiloxane), a poly(co-hydrogensilsesquioxane-((C$_1$-C$_{20}$)alkyl)silsesquioxane), and a poly(co-hydrogensilsesquioxane-((C$_6$-C$_{20}$)arypsilsesquioxane), wherein each fluoro(C$_m$)alkyl independently has 1 to 2m+1 fluorine groups and m is independently 1 to 20.

Embodiment 67 is the method of any one of Embodiments 1-66, wherein the precursor adhesive composition further comprises at least one of (ViMe$_2$SiO$_{1/2}$)$_{1-8}$(Me$_2$SiO$_{2/2}$)$_{60-180}$(SiO$_{4/2}$)$_{1-2}$, (ViMe$_2$SiO$_{1/2}$)$_{5-20}$(Me$_3$SiO$_{1/2}$)$_{15-55}$(SiO$_{4/2}$)$_{25-85}$, (ViMe$_2$SiO$_{1/2}$)$_2$(Me$_2$SiO$_{2/2}$)$_{75-225}$, (ViMe$_2$SiO$_{1/2}$)$_2$(R$^f$MeSiO$_{2/2}$)$_{100-800}$(Me$_2$SiO$_{2/2}$)$_{400-2000}$(ViMeSiO$_{2/2}$)$_{2-30}$, (ViMe$_2$SiO$_{1/2}$)$_2$(Me$_2$SiO$_{2/2}$)$_{400-1200}$, (Me$_3$SiO$_{1/2}$)$_2$(Me$_2$SiO$_{2/2}$)$_{1-6}$(HMeSiO$_{2/2}$)$_{3-9}$, (HMe$_2$SiO$_{1/2}$)$_{1-2}$(SiO$_{4/2}$)$_{0.5-1.5}$ wherein the unit subscripts indicate mole ratios thereof, $(Me_3SiO_{1/2})_2(R^fMeSiO_{2/2})_{2-40}(HMeSiO_{2/2})_{5-80}$, $(HMe_2SiO_{1/2})_2(Me_2SiO_{2/2})_{50-200}$, $(HSiO_{3/2})_{0.001-1}(MeSiO_{3/2})_{1.5-0.1}$ wherein the unit subscripts indicate mole ratios thereof, and $(HSiO_{3/2})_{0.001-1}(C_6H_5SiO_{3/2})_{1.5-0.1}$ wherein the unit subscripts indicate mole ratios thereof, wherein at each occurrence $R^f$ is independently a fluoro($C_m$)alkyl that is otherwise unsubstituted or is further substituted and has 1 to 2m+1 fluorine groups wherein m is independently 1 to 20, wherein the ($C_m$)alkyl group is uninterrupted or interrupted with 1, 2, or 3 interrupting groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-.

Embodiment 68 is the method of any one of Embodiments 1-67, wherein the precursor adhesive composition further comprises at least one of $(ViMe_2SiO_{1/2})_4(Me_2SiO_{2/2})_{120}(SiO_{4/2})$, $(ViMe_2SiO_{1/2})_{11}(Me_3SiO_{1/2})_{34}(SiO_{4/2})_{55}$, $(ViMe_2SiO_{1/2})_2(Me_2SiO_{2/2})_{150}$, $(ViMe_2SiO_{1/2})_2(R^fMeSiO_{2/2})_{300-600}(Me_2SiO_{2/2})_{800-1000}(ViMeSiO_{2/2})_{5-15}$, $(ViMe_2SiO_{1/2})_2(Me_2SiO_{2/2})_{600}$, $(Me_3SiO_{1/2})_2(Me_2SiO_{2/2})_{3-4}(HMeSiO_{2/2})_{5-6}$, $(HMe_2SiO_{1/2})_{1.58}(SiO_{4/2})$ wherein the unit subscripts indicate mole ratios thereof, $(Me_3SiO_{1/2})_2(R^fMeSiO_{2/2})_{5-20}(HMeSiO_{2/2})_{10-40}$, $(HMe_2SiO_{1/2})_2(Me_2SiO_{2/2})_{100}$, $(HSiO_{3/2})_{0.01-0.5}(MeSiO_{3/2})_{1-0.5}$ wherein the unit subscripts indicate mole ratios thereof, and $(HSiO_{3/2})_{0.01-0.5}(C_6H_5SiO_{3/2})_{1-0.5}$ wherein the unit subscripts indicate mole ratios thereof, wherein at each occurrence $R^f$ is independently a fluoro($C_m$) alkyl that is otherwise unsubstituted or is further substituted and has 1 to 2m+1 fluorine groups wherein m is independently 1 to 20, wherein the ($C_m$)alkyl group is uninterrupted or interrupted with 1, 2, or 3 interrupting groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-.

Embodiment 69 is the method of any one of Embodiments 1-68, wherein the precursor adhesive composition has an Si—H to alkenyl ratio of 0.1:1 to 10:1.

Embodiment 70 is the method of any one of Embodiments 1-69, wherein the precursor adhesive composition has an Si—H to alkenyl ratio of 0.7:1 to 2:1.

Embodiment 71 is the method of any one of Embodiments 1-70, wherein the precursor adhesive composition further comprises at least one of a surfactant, emulsifier, dispersant, polymeric stabilizer, crosslinking agent, polymer, polymerization or crosslinking catalysts, rheology modifier, density modifier, aziridine stabilizers, cure modifier, free radical initiator, diluent, acid acceptor, antioxidant, heat stabilizer, flame retardant, scavenging agent, silylating agent, foam stabilizer, solvent, hydrosilylation-reactive diluent, plasticizer, filler, inorganic particle, pigment, dye, desiccants, liquid, a polyether having at least one alkenyl or akynyl group per molecule, thickening agent, stabilizing agent, wax, wax-like material, silicone, organofunctional siloxane, alkylmethylsiloxanes, siloxane resin, silicone gum, silicone carbinol fluid, water soluble or water dispersible silicone polyether composition, silicone rubber, hydrosilylation catalyst inhibitor, adhesion promoter, heat stabilizer, UV stabilizer, and a flow control additive.

Embodiment 72 is the method of any one of Embodiments 1-71, wherein the adhesive delamination layer has a thickness of 0.1 μm to 500 μm.

Embodiment 73 is the method of any one of Embodiments 1-72, wherein the securing provides a display device processing intermediate wherein the adhesive delamination layer is directly on the carrier substrate with no intervening layers.

Embodiment 74 is the method of any one of Embodiments 1-73, wherein the securing provides a display device processing intermediate wherein an adhesion promoter layer is between the carrier substrate and the adhesive delamination layer.

Embodiment 75 is the method of Embodiment 74, wherein the adhesion promoter layer comprises a cured product of curing an adhesion promoter precursor composition comprising at least one of a silane, an organosilane, an organosiloxane, an organotitanate, an organozirconate, a zirconoaluminate, a phosphate ester, acrylic acid or a salt or ester thereof, methylacrylic acid or a salt or ester thereof, a polyurethane monomer or oligomer, vinyl phosphonic acid or a salt or ester thereof, vinyl sulfonic acid or a salt or ester thereof, and 2-acrylamido-2-methyl propane sulfonic acid or a salt or ester thereof.

Embodiment 76 is the method of any one of Embodiments 74-75, wherein the adhesion promoter layer comprises a cured product of curing an adhesion promoter precursor composition comprising at least one of a silane or siloxane comprising at least one of a trialkoxysiloxy group, a trialkoxysilylalkyl group, a hydrosilyl group, an alkenyl group, an epoxy-functional group, an amino group, a halosilyl group, a mercaptosilyl group, and a fluoroalkylsilyl group.

Embodiment 77 is the method of any one of Embodiments 74-76, wherein the adhesion promoter layer has a thickness of 0.0001 μm to 500 μm.

Embodiment 78 is the method of any one of Embodiments 74-77, wherein no intervening layers occur between the adhesion promoter layer and the carrier substrate or between the adhesion promoter layer and the adhesive delamination layer.

Embodiment 79 is the method of any one of Embodiments 1-78, wherein the securing comprises placing the display device substrate on the carrier substrate with at least one of the precursor adhesive composition and the adhesive delamination layer therebetween.

Embodiment 80 is the method of any one of Embodiments 1-79, further comprising forming the adhesive delamination layer on at least one of the carrier substrate and the display device substrate prior to the securing of the display device substrate.

Embodiment 81 is the method of Embodiment 80, wherein the forming comprises placing the precursor adhesive composition on at least one of the carrier substrate and the display device substrate, and curing the precursor adhesive composition to form the cured product of curing the precursor adhesive composition.

Embodiment 82 is the method of Embodiment 81, wherein the placing comprises placing the precursor adhesive composition on at least one of the carrier substrate and the display device using at least one of spraying, spinning, a draw-down bar, a doctor-blade, and dipping.

Embodiment 83 is the method of any one of Embodiments 80-82, further comprising bonding an adhesion promoter layer to the carrier substrate before forming the adhesive delamination layer thereon.

Embodiment 84 is the method of any one of Embodiments 80-83, further comprising bonding an adhesion promoter layer to the adhesive delamination layer prior to securing the carrier substrate thereto.

Embodiment 85 is the method of any one of Embodiments 1-84, wherein the securing provides a display device processing intermediate wherein the adhesive delamination layer is directly on the display device substrate with no intervening layers.

Embodiment 86 is the method of any one of Embodiments 1-85, wherein the securing provides a display device processing intermediate wherein a release layer is between the adhesive delamination layer and the display device substrate.

Embodiment 87 is the method of Embodiment 86, wherein the release layer comprises a cured product of curing a release layer precursor composition comprising at least one of a fluorosilane, a fluorosiloxane, a fluoroorganosilane, a fluoroorganosiloxane, a fluorinated silicon resin, a fluorinated silsesquioxane resin, a ($C_6$-$C_{20}$)arylsiloxane, and a (substituted or unsubstituted ($C_1$-$C_{20}$)hydrocarbyl)-silsesquioxane.

Embodiment 88 is the method of any one of Embodiments 86-87, wherein the release layer comprises a cured product of curing a release layer precursor composition comprising at least one of a fluoro($C_1$-$C_{200}$)hydrocarbyl-substituted($C_1$-$C_5$)alkoxysilane, linear ($C_2$-$C_{20}$)alkenyl-functionalized fluoro($C_1$-$C_{20}$)alkyl-substituted organopolysiloxane, a poly(co-hydrogensilsesquioxane-(($C_1$-$C_{20}$)alkyl)silsesquioxane), and a poly(co-hydrogensilsesquioxane-(($C_6$-$C_{20}$)arypsilsesquioxane).

Embodiment 89 is the method of any one of Embodiments 86-88, wherein the release layer comprises a cured product of curing a release layer precursor composition comprising at least one of $F((CF_2)_3O)_{cc}(CF_2)_{0-10}(CH_2)_{0-10}(O)_{0-1}(CH_2)_{0-10}Si(OMe)_3$, $(ViMe_2SiO_{1/2})_2(R^fMeSiO_{2/2})_{150-1200}(Me_2SiO_{2/2})_{400-2000}(ViMeSiO_{2/2})_{2-30}$, $(HSiO_{3/2})_{0.001-1}(MeSiO_{3/2})_{1.5-0.1}$ wherein the unit subscripts indicate mole ratios thereof, and $(HSiO_{3/2})_{0.001-1}(C_6H_5SiO_{3/2})_{1.5-0.1}$ wherein the unit subscripts indicate mole ratios thereof, wherein cc is 0 to 200, and wherein $R^f$ is independently a fluoro($C_m$)alkyl that is otherwise unsubstituted or is further substituted and has 1 to 2m+1 fluorine groups wherein m is independently 1 to 20, wherein the ($C_m$)alkyl group is uninterrupted or interrupted with 1, 2, or 3 interrupting by 0, 1, 2, or 3 groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-.

Embodiment 90 is the method of any one of Embodiments 86-89, wherein the release layer comprises a cured product of curing a release layer precursor composition comprising at least one of $F((CF_2)_3O)_{cc}CF_2CF_2CH_2O(CH_2)_3Si(OMe)_3$, $(ViMe_2SiO_{1/2})_2(R^fMeSiO_{2/2})_{300-600}(Me_2SiO_{2/2})_{800-1000}(ViMeSiO_{2/2})_{5-15}$, $(HSiO_{3/2})_{0.01-0.5}(MeSiO_{3/2})_{1-0.5}$ wherein the unit subscripts indicate mole ratios thereof, and $(HSiO_{3/2})_{0.01-0.5}(C_6H_5SiO_{3/2})_{1-0.5}$ wherein the unit subscripts indicate mole ratios thereof, wherein cc is 17 to 25, and wherein $R^f$ is independently a fluoro($C_m$)alkyl that is otherwise unsubstituted or is further substituted and has 1 to 2m+1 fluorine groups wherein m is independently 1 to 20, wherein the ($C_m$)alkyl group is uninterrupted or interrupted with 1, 2, or 3 interrupting groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-.

Embodiment 91 is the method of any one of Embodiments 86-90, wherein the release layer has a thickness of 0.0001 μm to 500 μm.

Embodiment 92 is the method of any one of Embodiments 86-91, wherein no intervening layers occur between the adhesive delamination layer and the release layer or between the release layer and the display device substrate.

Embodiment 93 is the method of any one of Embodiments 1-92, wherein securing the display device substrate to the carrier substrate with the adhesive delamination layer comprises securing the display device substrate to the adhesive delamination layer via a release layer.

Embodiment 94 is the method of any one of Embodiments 1-93, further comprising processing the display device substrate.

Embodiment 95 is the method of Embodiment 94, wherein processing the display device substrate comprises at least one of washing, drying, forming a film, applying a liquid photoresist, exposure to light, development, etching, resist removal, sealing, vapor deposition, adhesion treatment, heating, annealing, irradiating, cooling, and at least one of placing, forming and modifying on the display device substrate at least one of a semiconductor material, a semiconductor device, a diode, a light emitting diode, a transistor, a transistor array, a capacitor, a conductive pathway, a circuit pattern, a gate line, a data line, an electrical connector, an electrode, a transparent electrode, an electrical insulator, an electrically insulating layer, a protective layer, a color filter, a liquid crystal, a hole injection layer, a hole transporting layer, a light emitting layer, a passivation layer, an electrophoretic film, and an electron transporting layer.

Embodiment 96 is the method of any one of Embodiments 1-95, further comprising removing the display device substrate from the carrier substrate.

Embodiment 97 is the method of Embodiment 96, wherein the removing comprises peeling the display device substrate from the carrier substrate using a 90 degree peel force of 1 g/cm to 200 g/cm.

Embodiment 98 is the method of any one of Embodiments 96-97, wherein the removing comprises peeling the display device substrate from the carrier substrate using a 90 degree peel force of 2 g/cm to 60 g/cm.

Embodiment 99 is a method of forming a display device or display device component comprising the method of any one of Embodiments 1-98.

Embodiment 100 is a display device or display device component formed by the method of any one of Embodiments 1-99.

Embodiment 101 is a method of processing a display device substrate, the method comprising: securing the display device substrate to a carrier substrate with an adhesive delamination layer comprising a cured product of curing a precursor adhesive composition comprising 0.1 wt % to 99 wt % Component (A), wherein Component (A) is a hydrogenorganopolysiloxane chosen from $(HR^1{}_2SiO_{1/2})_2(R^1{}_2SiO_{2/2})_{1-2000}$ and $(HR^1{}_2SiO_{1/2})_{m1}(R^1{}_3SiO_{1/2})_{m2}(HR^1SiO_{2/2})_{d1}(R^1{}_2SiO_{2/2})_{d2}(R^1SiO_{3/2})_{t1}(HSiO_{3/2})_{t2}(SiO_{4/2})_{q1}$, wherein subscripts m1, m2, d1, d2, t1, t2, and q1 and functional group $R^1$ are independently as defined earlier; and 0.1 wt % to 99.9 wt %, alternatively 0.1 to 99 wt % Component (B), wherein Component (B) is an alkenyl-functionalized organopolysiloxane chosen from $(R^2R^1{}_2SiO_{1/2})_2(Me_2SiO_{2/2})_{1-2000}$ and $(R^2R^1{}_2SiO_{1/2})_{m1}(R^1{}_3SiO_{1/2})_{m2}(R^2R^1SiO_{2/2})_{d1}(R^1{}_2SiO_{2/2})_{d2}(R^1SiO_{3/2})_{t1}(R^2SiO_{3/2})_{t2}(SiO_{4/2})_{q1}$, wherein subscripts m1, m2, d1, d2, t1, t2, and q1 and functional groups $R^1$ and $R^2$ are independently as defined earlier; wherein at least one of Component (A) and Component (B) is non-linear, at each occurrence $R^1$ is independently a substituted or unsubstituted ($C_1$-$C_{20}$) hydrocarbyl uninterrupted or interrupted with 1, 2, or 3 interrupting groups chosen from —O—, —S—, substituted or unsubstituted —NH—, —Si(($C_1$-$C_5$)alkoxy)$_2$-, and —Si(($C_1$-$C_5$)alkyl)$_2$-, and at each occurrence $R^2$ is independently a substituted or unsubstituted ($C_2$-$C_{20}$)alkenyl uninterrupted or interrupted with 1, 2, or 3 interrupting groups chosen from —O—, —S—, substituted or unsubstituted —NH—, —(O—($C_2$-$C_3$)alkylene)$_n$- wherein n is 1 to 1,000, —Si $((C_1\text{-}C_5)\text{alkoxy})_2$-, and —Si$((C_1\text{-}C_5)\text{alkyl})_2$-. In the precursor adhesive composition comprising Components (A) and (B), the total amount of Components (A) and (B) is from 50 wt % to 99 wt %.

Embodiment 102 is a display device processing intermediate comprising: a carrier substrate; an adhesive delamination layer on the carrier substrate comprising a cured product of curing a precursor adhesive composition comprising Component (A), a hydrogenorganopolysiloxane; and Component (B), a $(C_2\text{-}C_{20})$alkenyl-functionalized organopolysiloxane, wherein the $(C_2\text{-}C_{20})$alkenyl group is uninterrupted or interrupted with 1, 2, or 3 interrupting groups independently chosen from —O—, —S—, substituted or unsubstituted —NH—, —(O—$(C_2\text{-}C_3)$alkylene)$_n$- wherein n is 1 to 1,000, —Si$((C_1\text{-}C_5)$alkoxy$))_2$-, and —Si$((C_1\text{-}C_5)$alkyl$))_2$-; wherein at least one of Component (A) and Component (B) is non-linear; and a display device substrate secured to the carrier substrate via the adhesive delamination layer.

Embodiment 103 is the processing intermediate of Embodiment 102, further comprising an adhesion promoter layer between the carrier substrate and the adhesive delamination layer.

Embodiment 104 is the processing intermediate of any one of Embodiments 102-103, further comprising a release layer between the adhesive delamination layer and the display device substrate.

Embodiment 105 is a display device processing intermediate comprising: a carrier substrate; an adhesive delamination layer on the carrier substrate comprising a cured product of curing a precursor adhesive composition comprising 0.1 wt % to 99 wt % Component (A), wherein Component (A) is a hydrogenorganopolysiloxane chosen from $(\text{HR}^1{}_2\text{SiO}_{1/2})_2(\text{R}^1{}_2\text{SiO}_{2/2})_{1\text{-}2000}$ and $(\text{HR}^1{}_2\text{SiO}_{1/2})_{m1}(\text{R}^1{}_3\text{SiO}_{1/2})_{m2}(\text{HR}^1\text{SiO}_{2/2})_{d1}(\text{R}^1{}_2\text{SiO}_{2/2})_{d2}(\text{R}^1\text{SiO}_{3/2})_{t1}(\text{HSiO}_{3/2})_{t2}(\text{SiO}_{4/2})_{q1}$, wherein subscripts m1, m2, d1, d2, t1, t2, and q1 and functional group $R^1$ are independently as defined earlier; and 0.1 wt % to 99.9 wt %, alternatively 0.1 to 99 wt % Component (B), wherein Component (B) is an alkenyl-functionalized organopolysiloxane chosen from $(\text{R}^2\text{R}^1{}_2\text{SiO}_{1/2})_2(\text{Me}_2\text{SiO}_{2/2})_{1\text{-}2000}$ and $(\text{R}^2\text{R}^1{}_2\text{SiO}_{1/2})_{m1}(\text{R}^1{}_3\text{SiO}_{1/2})_{m2}(\text{R}^2\text{R}^1\text{SiO}_{2/2})_{d1}(\text{R}^1{}_2\text{SiO}_{2/2})_{d2}(\text{R}^1\text{SiO}_{3/2})_{t1}(\text{R}^2\text{SiO}_{3/2})_{t2}(\text{SiO}_{4/2})_{q1}$, wherein subscripts m1, m2, d1, d2, t1, t2, and q1 and functional groups $R^1$ and $R^2$ are independently as defined earlier; wherein at least one of Component (A) and Component (B) is non-linear, at each occurrence $R^1$ is independently a substituted or unsubstituted $(C_1\text{-}C_{20})$ hydrocarbyl uninterrupted or interrupted with 1, 2, or 3 interrupting groups chosen from —O—, —S—, substituted or unsubstituted —NH—, —Si$((C_1\text{-}C_5)$alkoxy$))_2$-, and —Si$((C_1\text{-}C_5)$alkyl$))_2$-, and at each occurrence $R^2$ is independently a substituted or unsubstituted $(C_2\text{-}C_{20})$alkenyl uninterrupted or interrupted with 1, 2, or 3 interrupting groups chosen from —O—, —S—, substituted or unsubstituted —NH—, —(O—$(C_2\text{-}C_3)$alkylene)$_n$- wherein n is 1 to 1,000, —Si$((C_1\text{-}C_5)$alkoxy$))_2$-, and —Si$((C_1\text{-}C_5)$alkyl$))_2$-; and a display device substrate secured to the carrier substrate via the adhesive delamination layer. In the precursor adhesive composition comprising Components (A) and (B), the total amount of Components (A) and (B) is from 50 wt % to <100 wt %.

Embodiment 106 is the apparatus or method of any one or any combination of Embodiments 1-105 optionally configured such that all elements or options recited are available to use or select from.

Embodiment 107 is the adhesive delamination layer as described in any one of Embodiments 1-106.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to 5%" or "0.1% to 5%" includes not just 0.1% to 5%, but also the individual values (e.g., 1%, 2%, 3%, and 4%) and the sub-ranges (e.g., 0.1% to 0.5%, 1.1% to 2.2%, 3.3% to 4.4%) within the indicated range.

In the methods of manufacturing described herein, the acts or steps can be carried out in any order without departing from the principles of the invention, except when a temporal or operational sequence is explicitly recited or unambiguously implied. Furthermore, specified acts can be carried out concurrently unless explicit claim language recites that they be carried out separately. For example, a claimed act of doing step X and a claimed act of doing step Y can be conducted simultaneously within a single operation, and the resulting process will fall within the literal scope of the claimed process. In some aspects the acts or steps are carried out in the order as written.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B", which has the same meaning as A or B or A and B. Any use of section headings is intended to aid reading of the document and is not limiting; information that is relevant to a section heading may occur within or outside of that particular section.

The term "acyl" as used herein refers to a monovalent group formally derived by removing a HO— group from a carboxylic acid. The group may be unsubstituted or substituted.

The term "alkenyl" as used herein refers to a monovalent unsaturated aliphatic group containing at least one carbon-carbon double bond (C=C). Alkenyl may be straight chain, branched chain, or cyclic. Alkenyl may have 1 or 2 C=C. Alkenyl groups may have from 2 to 40 carbon atoms, or 2 to 20 carbon atoms, or 2 to 12 carbon atoms or, in some embodiments, from 2 to 8 carbon atoms. Examples include, but are not limited to vinyl, —CH=CH(CH$_3$), —CH=C(CH$_3$)$_2$, —C(CH$_3$)=CH$_2$, —C(CH$_3$)=CH(CH$_3$), —C(CH$_2$CH$_3$)=CH$_2$, cyclohexenyl, cyclopentenyl, cyclohexadienyl, butadienyl, pentadienyl, and hexadienyl among others. The group may be unsubstituted or substituted.

The term "alkoxy" as used herein refers to a monovalent saturated or unsaturated aliphatic-O— group, wherein the aliphatic group is acyclic or cyclic. Examples of linear alkoxy groups include but are not limited to methoxy, ethoxy, propoxy, butoxy, pentyloxy, and hexyloxy. Examples of branched alkoxy include but are not limited to isopropoxy, sec-butoxy, tert-butoxy, isopentyloxy, and isohexyloxy. Examples of cyclic alkoxy include but are not limited to cyclopropyloxy, cyclobutyloxy, cyclopentyloxy, and cyclohexyloxy. An alkoxy group can include 1 to 12, 1 to 20, or 1 to 40 carbon atoms bonded to the oxygen atom, and can further include double or triple bonds, and can also include heteroatoms. For example, an allyloxy group or a methoxyethoxy group is also an alkoxy group within the meaning herein, as is a methylenedioxy group in a context where two adjacent atoms of a structure are substituted therewith. The group may be unsubstituted or substituted.

The term "alkyl" as used herein refers to a monovalent saturated hydrocarbon group that is straight chain, branched chain, or cyclic and has from 1 to 40 carbon atoms, 1 to 20 carbon atoms, 1 to 12 carbons or, in some embodiments, from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and ante-isoalkyl groups as well as other branched chain forms of alkyl. The group may be unsubstituted or substituted. Representative substituted alkyl groups can be substituted one or more times with any of the groups listed herein, for example, amino, hydroxy, cyano, carboxy, nitro, thio, alkoxy, and halogen groups. The term "alkylene" as used herein indicates an alkanediyl wherein the two valencies can be present on any two carbon atoms therein.

The term "alkynyl" as used herein refers to a monovalent unsaturated aliphatic group containing at least one carbon-carbon triple bond (C≡C) and may be straight chain or branched chain. Alkynyl groups may have from 2 to 40 carbon atoms, 2 to 20 carbon atoms, or from 2 to 12 carbons or, in some embodiments, from 2 to 8 carbon atoms. Examples include, but are not limited to —C≡H, —C≡C(CH$_3$), —C≡C(CH$_2$CH$_3$), —CH$_2$C≡CH, —CH$_2$C≡C(CH$_3$), and —CH$_2$C≡C(CH$_2$CH$_3$) among others. The group may be unsubstituted or substituted.

"Alternatively" shall emphasize a distinct embodiment.

The term "amine" as used herein refers to a compound formally derived from ammonia (NH$_3$) by independently replacing 1, 2, or 3 hydrogen atoms on ammonia with hydrocarbyl group. The amine may be primary, secondary, and tertiary amines having, e.g., the formula N(group)$_3$ wherein each group can independently be H or non-H, such as alkyl, and aryl. Amines include but are not limited to R—NH$_2$, for example, alkylamines, arylamines, (alkylaryl) amines; R$_2$NH wherein each R is independently selected, such as dialkylamines, diarylamines, (aralkyl)amines, (alkyl)(aryl)amines, and heterocyclylamines; and R$_3$N wherein each R is independently selected, such as trialkylamines, dialkylarylamines, alkyldiarylamines, and triarylamines. The R may be unsubstituted or substituted.

The term "aryl" as used herein refers to monovalent carbocyclic aromatic hydrocarbon groups. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain 6 to 14 carbons in the ring portions of the groups. Aryl groups can be unsubstituted or substituted with organic groups or non-carbon-containing groups, as defined herein. The group may be unsubstituted or substituted. Representative substituted aryl groups can be mono-substituted or substituted more than once, such as, but not limited to, a phenyl group substituted at any one or more of 2-, 3-, 4-, 5-, or 6-positions of the phenyl ring, or a naphthyl group substituted at any one or more of 2- to 8-positions thereof.

"Can" or "may" confers a permitted choice, not an imperative.

The term "coating" or "film" as used herein refers to a continuous or discontinuous layer of material. The layer may be free standing or disposed on a surface of an article. The layer of material can penetrate the surface of the article and can fill areas such as pores, wherein the layer of material can have any three-dimensional shape, including a flat or curved plane. In one example, a coating can be formed on one or more surfaces, any of which may be porous or nonporous, by immersion in a bath of coating material.

The term "hydrocarbon" as used herein refers to a molecule that may be unsubstituted and consists of carbon and hydrogen atoms or may be substituted and includes carbon and hydrogen atoms and at least one heteroatom selected from halogen, N, O, S, P, and Si.

As used herein, the term "hydrocarbyl" refers to a monovalent functional group formally derived from a straight chain, branched, or cyclic hydrocarbon by removing a hydrogen atom therefrom, and can be alkyl, alkenyl, alkynyl, aryl, cycloalkyl, acyl, or any combination thereof. Hydrocarbyl groups can be shown as $(C_a\text{-}C_b)$hydrocarbyl, wherein a and b are integers and mean having any of a to b number of carbon atoms. For example, $(C_1\text{-}C_4)$hydrocarbyl means the hydrocarbyl group can be methyl ($C_1$), ethyl ($C_2$), propyl ($C_3$), or butyl ($C_4$). $(C_0\text{-}C_b)$hydrocarbyl means in certain embodiments there is no hydrocarbyl group.

The term "interrupted", as applied to a monovalent group having a radical at a backbone atom, means (i) or (ii): (i) in a monovalent group having 1 backbone atom, which thus has the radical: interrupted means formally inserted between the 1 backbone atom and the radical (e.g., a divalent interrupting group, Q, formally inserted in H$_3$C— to give H$_3$C-Q-); or (ii) in a monovalent group having 2 or more backbone atoms, wherein the radical is located on any one thereof: interrupted means formally inserted either between a backbone atom and the radical (e.g., as above) or between any two of the backbone atoms (e.g., a divalent interrupting group Q formally inserted in H$_3$C—CH$_2$— to give H$_3$C-Q-CH$_2$—). Typically each monovalent group that is interrupted may be independently interrupted by 1, 2 or 3 interrupting groups Q; alternatively by 1 or 2 interrupting groups Q; alternatively by 2 or 3 interrupting groups Q; alternatively by 1 interrupting group Q; alternatively by 2 interrupting groups Q; alternatively by 3 interrupting groups Q. When there are 2 or 3 Q groups, they typically are not bonded directly to each other (that is, the interrupted monovalent group having 2 or 3 interrupting groups Q may be free of a Q-Q group). Each interrupted monovalent group independently may be defined as described elsewhere herein (e.g., an interrupted hydrocarbyl or an interrupted (C$_2$-C$_{20}$)alkenyl). Each interrupting group Q independently may be defined as for the interrupting groups described elsewhere herein (e.g., —O—, —S—, substituted or unsubstituted —NH—, —(O—(C$_2$-C$_3$)alkylene)$_n$- wherein n is 1 to 1,000, —Si((C$_1$-C$_5$)alkoxy)$_2$-, or —Si((C$_1$-C$_5$)alkyl)$_2$-). The term "interrupted" may be applied to a molecule or to a multivalent group in an analogous manner as described above. The term "uninterrupted" means free of (lacking) a divalent interrupting group Q (i.e., 0 Q).

The term "linear" means lacking or being free of a branch point. For example, a linear polysiloxane (e.g., a linear hydrogenorganopolysiloxane and linear alkenyl-functional organopolysiloxane) has no (i.e., 0) branch points in its backbone. Thus, its backbone is consists of M units (e.g., R$^1$$_3$SiO$_{1/2}$, HR$^1$$_2$SiO$_{1/2}$, or Me$_3$SiO$_{1/2}$) and D units (e.g., R$^1$$_2$SiO$_{2/2}$, HR$^1$SiO$_{2/2}$, or Me$_2$SiO$_{2/2}$) only.

The term "non-linear" means having at least one branch point. For example, a non-linear polysiloxane (e.g., a non-linear hydrogenorganopolysiloxane and non-linear alkenyl-functional organopolysiloxane) has at least one branch point in its backbone. Each branch point independently may be a T unit (e.g., R$^1$SiO$_{3/2}$, R$^2$SiO$_{3/2}$, or HSiO$_{3/2}$) or a Q unit (SiO$_{4/2}$), as the case may be. The non-linear polysiloxane may, alternatively may not, further have M and/or D units, as the case may be.

The term "number-average molecular weight" ($M_n$) as used herein refers to the ordinary arithmetic mean of the molecular weight of individual molecules in a sample. It is defined as the total weight of all molecules in a sample divided by the total number of molecules in the sample. Experimentally, $M_n$ is determined by analyzing a sample divided into molecular weight fractions of species i having $n_i$ molecules of molecular weight $M_i$ through the formula $M_n = \Sigma M_i n_i / \Sigma n_i$. The $M_n$ can be measured by a variety of well-known methods including gel permeation chromatography, spectroscopic end group analysis, and osmometry. The measurement may use polystyrene standards of known $M_n$. If unspecified, molecular weights of polymers given herein are number-average molecular weights.

The term "oligomer" as used herein refers to a molecule having an intermediate relative molecular mass, the structure of which essentially includes from 2 to 4 repeat units derived, actually or conceptually, from molecules of lower relative molecular mass (e.g., monomers or oligomers of fewer repeat units). A molecule having an intermediate relative mass can be a molecule that has properties that vary with the removal of one or a few of the units. The variation in the properties that results from the removal of the one of more units can be a significant variation.

The term "organic group" as used herein refers to any monovalent or multivalent carbon-containing functional group. Each organic group independently may be unsubstituted, alternatively unsubstituted. For example, an oxygen-containing group such as an alkoxy group, aryloxy group, aralkyloxy group, oxo(carbonyl) group, a carboxyl group including a carboxylic acid, carboxylate, and a carboxylate ester; a sulfur-containing group such as an alkyl and aryl sulfide group; and other heteroatom-containing groups. Non-limiting examples of organic groups include OR, OOR, $OC(O)N(R)_2$, CN, $CF_3$, $OCF_3$, R, C(O), methylenedioxy, ethylenedioxy, $N(R)_2$, SR, SOR, $SO_2R$, $SO_2N(R)_2$, $SO_3R$, C(O)R, C(O)C(O)R, $C(O)CH_2C(O)R$, C(S)R, C(O)OR, OC(O)R, $C(O)N(R)_2$, $OC(O)N(R)_2$, $C(S)N(R)_2$, $(CH_2)_{0-2}N(R)C(O)R$, $(CH_2)_{0-2}N(R)N(R)_2$, N(R)N(R)C(O)R, N(R)N(R)C(O)OR, $N(R)N(R)CON(R)_2$, $N(R)SO_2R$, $N(R)SO_2N(R)_2$, N(R)C(O)OR, N(R)C(O)R, N(R)C(S)R, $N(R)C(O)N(R)_2$, $N(R)C(S)N(R)_2$, N(COR)COR, N(OR)R, $C(=NH)N(R)_2$, $C(O)N(OR)R$, C(=NOR)R, and substituted or unsubstituted ($C_1$-$C_{100}$)hydrocarbyl, wherein R can be hydrogen (in examples that include other carbon atoms) or a carbon-based group, and wherein the carbon-based group can be substituted or unsubstituted.

Organosiloxanes may contain different types of units, at least one of which contains a silicon-bonded organic group (Si—C). Methyl-containing siloxane units are $[(CH_3)_3SiO_{1/2}]$, $[(CH_3)_2SiO_{2/2}]$, and $[(CH_3)SiO_{3/2}]$, which are sometimes abbreviated as M, D, and T, respectively, i.e., without superscripts. Another type of organosiloxane unit is $[SiO_{4/2}]$, which is abbreviated as Q. Other types of organosiloxane units are M, D, and T units that contain at least one occurrence of an atom or group in place of a methyl. For example, the 1, 2 or 3 methyl(s) in a $[(CH_3)_3SiO_{1/2}]$ unit; the 1 or 2 methyl(s) in a $[(CH_3)_2SiO_{2/2}]$ unit; and the 1 methyl in a $[(CH_3)SiO_{3/2}]$ unit independently may be replaced by an atom such as H or halogen, an inorganic group such as hydroxyl, or an organic group other than methyl. Such M, D, and T units containing replacement atom(s) or group(s) in place of methyl are sometimes abbreviated by writing the replacement atom(s) or group(s) in superscript above the respective M, D, or T letter. The number of methyls that have been replaced is indicated by the number of superscripted groups. For example, $M^H$ indicates an M unit having one vinyl (Vi) and two methyls (i.e., $[Vi(CH_3)_2SiO_{1/2}]$), whereas $M^{2Vi}$ indicates an M unit having two vinyls and one methyl (i.e., $[Vi_2(CH_3)SiO_{1/2}]$). Similarly, $D^H$ indicates a D unit having one hydrogen atom and one methyl (i.e., $[H(CH_3)SiO_{2/2}]$), whereas $D^{H,Ph}$ indicates a D unit having 0 methyl, one H atom, and one phenyl (i.e., $[H(Ph)SiO_{2/2}]$). $T^{OAlk}$ indicates a T unit having 0 methyl and one alkoxy group (i.e., $[AlkOSiO_{3/2}]$), wherein AlkO and OAlk indicates a same alkoxy group.

As used herein, the term "polymer" refers to a molecule having at least five repeat units and can include homopolymers and interpolymers such as copolymers.

Unless indicated otherwise by chemical nomenclature or valence requirements, each "R" group herein is a monovalent group. Examples of "R" groups are R, $R^1$, $R^2$, $R^A$, $R^B$, and $R^f$.

The term "resin" as used herein refers to polysiloxane material of any viscosity including a molecule that includes at least four siloxane units, wherein at least one siloxane unit is bonded via a Si—O—Si bond to three or four other siloxane units. In one example, the polysiloxane material includes a majority of T and/or Q units, as defined herein.

The term "solvent" as used herein refers to a liquid that can dissolve a solid, liquid, or gas. Non-limiting examples of solvents are silicone fluids, organic compounds having boiling points from 30° to 300° C. such as alcohols, water, ionic liquids, and supercritical fluids. In a particular mixture embodiment herein, a solvent may, alternatively may not fully dissolve a particular constituent. A solvent that does not fully dissolve a particular constituent may function as a carrier, diluent, dispersant, hosting medium, or supernatant.

The term "substantially" as used herein refers to a majority of, or mostly, as in at least 60%, 70%, 80%, 90%, 95%, 96%, 97%, 98%, 99%, 99.5%, 99.9%, 99.99%, or 99.999%; alternatively 100%.

The term "substituted" as used herein in conjunction with a molecule or an organic group as defined herein refers to the state in which one or more hydrogen atoms contained therein are replaced by one or more non-hydrogen atoms. The term "functional group" or "substituent" as used herein refers to a group that can be or is substituted onto a molecule or onto an organic group. Examples of substituents or functional groups include, but are not limited to, a halogen (e.g., F, Cl, Br, and I; alternatively F, Cl, or Br; alternatively F or Cl; alternatively Cl or Br; alternatively Cl); an oxygen atom in groups such as hydroxy groups, alkoxy groups, aryloxy groups, aralkyloxy groups, oxo (carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, hydroxyamines, nitriles, nitro groups, N-oxides, hydrazides, azides, and enamines; and other heteroatoms in various other groups. Non-limiting examples of substituents that can be bonded to a substituted carbon (or other) atom include F, Cl, Br, I, OR, $OC(O)N(R)_2$, CN, NO, $NO_2$, $ONO_2$, azido, $CF_3$, $OCF_3$, R, O, =O (oxo), S (thiono), C(O), S(O), methylenedioxy, ethylenedioxy, $N(R)_2$, SR, SOR, $SO_2R$, $SO_2N(R)_2$, $SO_3R$, C(O)R, C(O)C(O)R, $C(O)CH_2C(O)R$, C(S)R, C(O)OR, OC(O)R, $C(O)N(R)_2$, $OC(O)N(R)_2$, $C(S)N(R)_2$, $(CH_2)_{0-2}N(R)C(O)R$, $(CH_2)_{0-2}N(R)N(R)_2$, N(R)N(R)C(O)R, N(R)N(R)C(O)OR, $N(R)N(R)CON(R)_2$, $N(R)SO_2R$, $N(R)SO_2N(R)_2$, N(R)C(O)OR, N(R)C(O)R, N(R)C(S)R, $N(R)C(O)N(R)_2$, $N(R)C(S)N(R)_2$, N(COR)COR, N(OR)R, $C(=NH)N(R)_2$, C(O)N(OR)R, and C(=NOR)R, wherein R can be hydrogen or a carbon-based group; for example, R can be hydrogen, $(C_1-C_{100})$hydrocarbyl, alkyl, acyl, cycloalkyl, aryl, aralkyl, heterocyclyl, heteroaryl, or heteroarylalkyl; or wherein two R groups bonded to a nitrogen atom or to adjacent nitrogen atoms can together with the nitrogen atom or atoms form a heterocyclyl. In the substituents, each R is independently unsubstituted or substituted with F.

As used herein "Vi" indicates a vinyl group, $-CH_2=CH_2$. As used herein, "Me" indicates a methyl group, $-CH_3$. "Ph" means phenyl, $C_6H_5-$.

Any compound includes all "Isotopic forms" thereof, including natural abundance isotopes, isotopically-enriched isotopes, and mixtures thereof. In some aspects, the isotopic forms are the natural abundance isotopes, alternatively the isotopically-enriched isotopes. The isotopically-enriched forms of a silicon-containing compound have a greater-than-natural-abundance amount of deuterium, tritium, $^{29}Si$, $^{30}Si$, $^{32}Si$, or a combination of any two or more thereof. Isotopically-enriched forms of the compound may have additional uses wherein detection of the isotopically-enriched compound or an isotopically-enriched material made or synthesized therefrom would be helpful. Examples of such uses are medical research and anti-counterfeiting applications.

In some aspects any composition may be free of one or more of the following chemical elements: (i) at least one chemical element from any one of Groups 2 to 13 and 18, including the lanthanoids and actinoids; (ii) at least one chemical element from any one of the third to sixth rows of the Periodic Table of the Elements, including the lanthanoids and actinoids; or (iii) both (i) and (ii), except not excluding Si, O, H, C, N, a halogen, a metal of any catalyst described elsewhere herein. In some aspects any composition does not contain a chemical element having any one of the following atomic numbers: 2, 3, 4, 5, 7, 10, 11, 12, 13, 15, 16, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84. 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, and 116, except for the metal of any catalyst described elsewhere herein. "Chemical element" or "atom", a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/).

In compounds that are salts having positively charged counterions, the counterion can be any suitable positively charged counterion. For example, the counterion can be ammonium ($NH_4^+$), or an alkali metal such as sodium (Na+), potassium ($K^+$), or lithium ($Li^+$). In some embodiments, the counterion can have a positive charge greater than +1, which can in some embodiments complex to multiple ionized groups, such as $Zn^{2+}$, $Al^{3+}$, or alkaline earth metals such as $Ca^{2+}$ or $Mg^{2+}$.

In various embodiments are certain advantages over existing methods for processing display device substrates where the existing methods include mounting the display device substrate on a carrier. For example, in some embodiments, compared to existing methods, the method can better withstand the harsh chemical treatments (e.g., acids having a logarithmic acid dissociation constant, pKa, of ≤3) or elevated temperatures (e.g., ≥200° C.) used during certain manufacturing processes. In some embodiments, the method can more firmly retain the display device substrate during certain manufacturing processes than existing methods. Some existing mounting methods allow for a greater amount of relative movement between the carrier and the display substrate or of flexing of the display substrate, leading to misalignment of electronic components on the display substrate. In various embodiments, the present method can allow the display substrate to be removed from the carrier more easily, e.g., with a lower peeling force, than existing methods. A failure due to movement of the display substrate relative to the carrier during manufacturing, or due to damage to the display substrate during mounting, manufacturing, or removal, can mean a shutdown of an entire manufacturing line. In various embodiments is a method of processing a display device substrate with a lower failure rate than existing methods.

In various embodiments, the method can provide an adhesive delamination layer that securely holds the display device substrate during processing without an adhesion promoter and facilitates easy removal of the display device substrate without a release layer. In some embodiments, after removal of the display device substrate from the carrier, the carrier can be reused several times without an extensive recycling procedure. In some embodiments, conventional equipment and chemicals can be used with little or no modification to perform the method, in contrast to the exotic equipment or chemicals required by existing methods.

The display device substrate can include any suitable material that can be formed into a component for a display device. The carrier substrate can be any suitable material, such that the method can be carried out as described herein. In various embodiments the carrier substrate includes or is the same material as the display device substrate. In some embodiments, the display device substrate and carrier substrate independently includes a silicate glass, silicon (e.g., silicon wafer), ceramic, plastic (e.g., a thermoplastic organic or silicone polymer, metal (e.g. steel, copper), or a combination thereof. The display device substrate and carrier substrate independently can be a treated substrate, having any suitable one or more chemical treatments or physical treatments performed thereon, such that that display device substrate and/or carrier substrate independently includes one or more coatings or processing intermediates thereon, or includes a surface having any suitable topography such as a smooth, polished, or textured surface. In some embodiments, the display device substrate and/or carrier substrate can have a raw surface that is uncoated and untreated. The display device substrate can be flexible or rigid. The display device substrate can have any suitable thickness, such as 1 nm to 5 mm, 1 nm to 0.5 mm, or 1 nm to 100 μm, or more than 5 mm. The carrier substrate can have any suitable amount of rigidity, such that the display device substrate can be securely held during processing and subsequently removed from the carrier substrate. The carrier substrate can have any suitable thickness, such that the method can be performed as described herein. For example, the carrier substrate can have a thickness as 0.1 mm to 1,000 mm, or less than 0.1 mm, or 0.2 mm to 500 mm, or more than 1,000 mm. In various embodiments, the carrier substrate and the display device substrate can include or can be materials that have similar linear expansion coefficients, such as differing by no more than $150 \times 10^{-7}/°$ C. or less, $50 \times 10^{-7}/°$ C. or less, or no more than $1 \times 10^{-10}/°$ C. or less, or no more than $1 \times 10^{-9}/°$ C., $1 \times 10^{-8}/°$ C., $1 \times 10^{-7}/°$ C., $1 \times 10^{-6}/°$ C., $1 \times 10^{-5}/°$ C., $1 \times 10^{-4}/°$ C., $1 \times 10^{-3}/°$ C., $1 \times 10^{-2}/°$ C., or no more than $1 \times 10^{-1}/°$ C. or more.

The display device substrate can include any suitable display device processing precursor that can be processed to form a display device component of at least one of a light-emitting diode display (LED), an electroluminescent display (ELD), an electronic paper display, a plasma display panel (PDP), a liquid crystal display (LCD), a high-performance addressing display (HPA), thin-film transistor display (TFT), organic light-emitting diode display (OLED), surface-conduction electron-emitter display (SED), a laser TV display, a carbon nanotubes display, a quantum dot display, and an interferometric modulator display (IMOD).

The adhesive delamination layer can have any suitable thickness, such that the method can be carried out as described herein. In some embodiments, the adhesive delamination layer can have a thickness of 0.1 µm to 500 µm, 5 µm to 150 µm, 10 µm to 100 µm, or more than 500 µm.

The securing of the display device substrate to the carrier substrate via the adhesive delamination layer can be any suitable securing. The securing can include contacting the display device substrate and at least one of the adhesive delamination layer and the precursor adhesive composition. The contacting can be performed using various means such as pressure bonding with a roll or press, under conditions suitable to achieve close adherence of the display device substrate to the adhesive delamination layer, such as vacuum (e.g., to remove air and prevent bubbles), and optionally with heat, light, or irradiation (e.g., to cure the precursor adhesive composition). By carrying out pressure bonding under vacuum, even if some bubbles remain, growth of the bubbles during heating is reduced or eliminated, avoiding or reducing formation of a deformation defect of the laminated carrier substrate and display device substrate. In some embodiments, the adhesive delamination layer is cured prior to, alternatively after, alternatively prior to and after the contacting of the display device substrate to the adhesive delamination layer. The carrier substrate, the display device substrate, or both, can be washed prior to performing the securing, such as prior to contacting either substrate with the adhesive delamination layer or the precursor adhesive composition.

The method can include forming the adhesive delamination layer on at least one of the carrier substrate and the display device substrate prior to the securing of the display device substrate to the carrier substrate. The forming can include placing the precursor adhesive composition on at least one of the carrier substrate and the display device substrate, and curing the precursor adhesive composition to form the cured product thereof. Placing the precursor adhesive composition on at least one of the carrier substrate and the display device substrate can occur prior to securing the display device substrate to the carrier substrate. Placing the precursor adhesive composition on at least one of the carrier substrate and the display device can include any suitable method, such as using at least one of spraying, spinning, a draw-down bar, a doctor-blade, and dipping.

Curing the precursor adhesive composition to form the adhesive delamination layer can occur before, during, and/or after securing the display device substrate to the carrier substrate. The term "cure" as used herein refers to converting a prepolymer or polymer into a polymer of higher molecular mass, and then into a network. Curing may comprise exposing the precursor adhesive composition to radiation in any form, heating, or allowing to undergo a physical or chemical reaction that results in hardening or an increase in [dynamic or kinematic?] viscosity measured at 25° C. In some embodiments, the curing of the precursor adhesive composition can be any suitable curing, such as free-radical curing, condensation curing, addition curing (e.g., hydrosilylation), any suitable crosslinking reaction, or a combination thereof. Curing can include the application of light (e.g., visible, infrared, ultraviolet), heat (e.g., 40° C. or less, or from 50° C. to 500° C., e.g., from 120° to 250° C., for a suitable time, such as 1 minute or less to 1 hour, or more, irradiation (e.g., electron beam, gamma ray, X-ray), or a combination thereof.

In various embodiments, the securing of the display device substrate to the carrier substrate via the adhesive delamination layer can provide a display device processing intermediate wherein the adhesive delamination layer is directly on the carrier substrate and/or on the display device substrate with no intervening layers therebetween. In other embodiments, one or more additional intervening layers can be formed or can occur between the adhesive delamination layer and the carrier substrate, such as an adhesion promoter layer and/or a release layer. In some embodiments, one or more additional intervening layers can occur between the adhesive delamination layer and the display device substrate, such as a release layer. In some embodiments the display device processing intermediate may contain the adhesion promoting layer between the adhesive delamination layer and the carrier substrate and the release layer between the adhesive delamination layer and the display device substrate.

In some embodiments, the securing of the carrier substrate and the display device substrate can include forming the adhesive delamination layer on a carrier substrate or display device substrate that includes an adhesion promoter layer. In some embodiments, the securing of the carrier substrate and the display device substrate can include bonding an adhesion promoter layer to the carrier substrate before forming the adhesive delamination layer on the carrier substrate or the display device substrate. The securing can provide a display device processing intermediate wherein an adhesion promoter layer is between the carrier substrate and the adhesive delamination layer. In some embodiments, no intervening layers occur 1) between the adhesion promoter layer and the carrier substrate, 2) between the adhesion promoter layer and the adhesive delamination layer, or 3) a combination thereof.

In some embodiments, the securing of the carrier substrate and the display device substrate can include securing the display device substrate to the adhesive delamination layer via a release layer, wherein the release layer is on the adhesive delamination layer or on the display device substrate prior to the securing. In some embodiments, the securing of the carrier substrate and the display device substrate can include bonding a release layer to the display device substrate or bonding a release layer to the adhesive delamination layer. The securing can provide a display device processing intermediate wherein a release layer is between the display device substrate and the adhesive delamination layer. In some embodiments, no intervening layers occur 1) between the release layer and the display device substrate, 2) between the release layer and the adhesive delamination layer, or 3) a combination thereof.

In some embodiments, the method is free of processing of the display device substrate. In some embodiments, the method can include processing the display device substrate. The processing of the display device substrate can include any suitable processing such as at least one of washing, drying, forming a film, applying a liquid photoresist, exposure to light, development, etching, resist removal, sealing, vapor deposition, adhesion treatment, heating, annealing, irradiating, cooling, and at least one of placing, forming and modifying on the display device substrate at least one of a semiconductor material, a semiconductor device, a diode, a light emitting diode, a transistor, a transistor array, a capacitor, a conductive pathway, a circuit pattern, a gate line, a data line, an electrical connector, an electrode, a transparent electrode, an electrical insulator, an electrically insulating layer, a protective layer, a color filter, a liquid crystal, a hole injection layer, a hole transporting layer, a light emitting layer, a passivation layer, an electrophoretic film, and an electron transporting layer.

In various embodiments, the method can include removing the display device substrate from the carrier substrate. The removing can occur before, alternatively after processing of the display device substrate. The removing can be performed in any suitable way, such that the display device substrate is removed from the carrier substrate. The removing can include removing the display device substrate from the carrier substrate such that substantially none of the adhesive delamination layer is adhered to the display device substrate after the removal, and such that substantially none of any other layer (e.g., release layer) is adhered to the display device substrate after the removal. The removing can include removing the display device substrate from the carrier substrate such that substantially none of the adhesive delamination layer is adhered to the display device substrate after the removal, wherein all or some of another layer (e.g., a release layer) is adhered to the display device substrate after the removal.

The removing can include physically removing such as peeling, chemically removing such as with acid or base treatment, or a combination thereof. The adhesive delamination layer and any other layers can be formed in such a way that a 90 degree peel force sufficient to remove the display device substrate from the carrier substrate can be 1 gram per centimeter (g/cm) to 200 g/cm, 2 g/cm to 60 g/cm, or 1 g/cm or less, or 100 g/cm to 200 g/cm. The length indicates the width of the overlapping and adhered portions of the display device substrate and the carrier substrate at the location of removal.

In some embodiments, the method can include forming a display device or display device component, such as after the removing. In other embodiments, the method can be performed without forming a display device or display device component.

In some aspects, including the ad rem numbered embodiments described later, Component (A) is the hydrogenorganopolysiloxane of formula $(HR^1_2SiO_{1/2})_2(R^1_2SiO_{2/2})_{1-2000}$ and Component (B) is the alkenyl-functionalized organopolysiloxane of formula $(R^2R^1_2SiO_{1/2})_2(Me_2SiO_{2/2})_{1-2000}$. In some aspects, including the ad rem numbered embodiments described later, Component (A) is the hydrogenorganopolysiloxane of formula $(HR^1_2SiO_{1/2})_2(R^1_2SiO_{2/2})_{1-2000}$ and Component (B) is the alkenyl-functionalized organopolysiloxane of formula $(R^2R^1_2SiO_{1/2})_{m1}(R^1_3SiO_{1/2})_{m2}(R^2R^1SiO_{2/2})_{d1}(R^1_2SiO_{2/2})_{d2}(R^1SiO_{3/2})_{t1}(R^2SiO_{3/2})_{t2}(SiO_{4/2})_{q1}$; wherein subscripts m1, m2, d1, d2, t1, t2, and q1 and functional groups $R^1$ and $R^2$ are independently as defined earlier. In some aspects, including the ad rem numbered embodiments described later, Component (A) is the hydrogenorganopolysiloxane of formula $(HR^1_2SiO_{1/2})_{m1}(R^1_3SiO_{1/2})_{m2}(HR^1SiO_{2/2})_{d1}(R^1_2SiO_{2/2})_{d2}(R^1SiO_{3/2})_{t1}(HSiO_{3/2})_{t2}(SiO_{4/2})_{q1}$; wherein subscripts m1, m2, d1, d2, t1, t2, and q1 and functional group $R^1$ are independently as defined earlier; and Component (B) is the alkenyl-functionalized organopolysiloxane of formula $(R^2R^1_2SiO_{1/2})_2(Me_2SiO_{2/2})_{1-2000}$. In some aspects, including the ad rem numbered embodiments described later, Component (A) is the hydrogenorganopolysiloxane of formula $(HR^1_2SiO_{1/2})_{m1}(R^1_3SiO_{1/2})_{m2}(HR^1SiO_{2/2})_{d1}(R^1_2SiO_{2/2})_{d2}(R^1SiO_{3/2})_{t1}(HSiO_{3/2})_{t2}(SiO_{4/2})_{q1}$ and Component (B) is the alkenyl-functionalized organopolysiloxane of formula $(R^2R^1_2SiO_{1/2})_{m1}(R^1_3SiO_{1/2})_{m2}(R^2R^1SiO_{2/2})_{d1}(R^1_2SiO_{2/2})_{d2}(R^1SiO_{3/2})_{t1}(R^2SiO_{3/2})_{t2}(SiO_{4/2})_{q1}$; all wherein subscripts m1, m2, d1, d2, t1, t2, and q1 and functional groups $R^1$ and $R^2$ are independently as defined earlier.

The precursor adhesive composition includes Component (A), a hydrogenorganopolysiloxane. Component (A) can be a single hydrogenorganopolysiloxane sharing common structural characteristics. The precursor adhesive composition also includes Component (B), an alkenyl-functionalized organopolysiloxane. Component (B) can be a single alkenyl-functionalized organopolysiloxane sharing common structural characteristics. At least one alkenyl group of Component (B) is suitable for free-radical polymerization or hydrosilylation, and includes a non-aromatic non-conjugated carbon-carbon double bond. The precursor adhesive composition can include any suitable one or more components in addition to Component (A) and Component (B). Component (A), Component (B), and optionally any other components present in the precursor adhesive composition, can be cured to form the adhesive delamination layer. Component (A) and Component (B) can cure via any suitable chemical mechanism, such as via hydrosilylation.

At least one of Component (A) and Component (B) is non-linear (e.g., branched, wherein the polymer has a non-linear backbone). In some embodiments, Component (A) is non-linear and Component (B) is linear. In some embodiments, Component (A) is linear and Component (B) is non-linear. In some embodiments, Component (A) is non-linear and Component (B) is non-linear. In some embodiments, at least one of Component (A) and Component (B) is fluoroorgano-substituted, such as a fluoroorganopolysiloxane.

Any suitable proportion of the precursor adhesive composition can be Component (A). In some embodiments, 0.1 wt % to 99 wt % of the precursor adhesive composition is Component (A), 0.1 to 80 wt %, 1 wt % to 80 wt %, 0.1 wt % to 40 wt %. Any suitable proportion of the precursor adhesive composition can be Component (B). In some embodiments, 0.1 wt % to 99.9 wt % of the precursor adhesive composition is Component (B), 10 wt % to 99.9 wt %, 60 wt % to 99 wt %, or 65 wt % to 99 wt %. In the precursor adhesive composition comprising Components (A) and (B), the total amount of Components (A) and (B) is from 50 wt % to <100 wt %; alternatively from 70 to 99 wt %; alternatively from 80 to 95 wt %; alternatively from 55 to 90 wt %; alternatively from 60 to 90 wt %.

In some embodiments, Component (A) can be non-linear. Component (A) can be of the formula: $(R^A_3SiO_{1/2})_w(R^A_2SiO_{2/2})_x(R^ASiO_{3/2})_y(SiO_{4/2})_z$. The subscripts y and z can be independently 0 to 5,000, 0 to 2,000, 0 to 1,000, 0 to 500, or 0 to 200. At least one of y and z can be greater than 0. The subscript w is 0 to 500, 0 to 100, 0 to 50, 0 to 10, or 1 to any prior upper endpoint, and subscript x is 0 to 5,000, 0 to 2,000, 0 to 1,000, 0 to 500, or 0 to 200. In some embodiments, Component (A) can be of the formula: $(HMe_2SiO_{1/2})_{1.58}(SiO_{4/2})$, wherein the unit subscripts indicate mole ratios thereof. In some embodiments, Component (A) can have a molecular weight of 100 g/mol to 10,000,000 g/mol, or 100 g/mol or less, or 1,000 to 5,000,000.

In some embodiments, Component (A) can be of the formula: $(R^A_3SiO_{1/2})_2(R^A_2SiO_{2/2})_x$. The subscript x can be 0 to 5,000, 0 to 2,000, 0 to 1,000, 0 to 500, or 0 to 200. In various embodiments, Component (A) can be of the formula: $(Me_3SiO_{1/2})_2(Me_2SiO_{2/2})_x(HMeSiO_{2/2})_x$, or $(HMe_2SiO_{1/2})_2(Me_2SiO_{2/2})_x$.

In various embodiments, Component (A) can be of the formula: $(Me_3SiO_{1/2})_2(Me_2SiO_{2/2})_{3-4}(HMeSiO_{2/2})_{5-6}$, or $(HMe_2SiO_{1/2})_2(Me_2SiO_{2/2})_{100}$.

In various embodiments, Component (A) can be chosen from $(HR^1{}_2SiO_{1/2})_2(R^1{}_2SiO_{2/2})_{1-2000}$; alternatively from $(HR^1{}_2SiO_{1/2})_{m1}(R^1{}_3SiO_{1/2})_{m2}(HR^1SiO_{2/2})_{d1}(R^1{}_2SiO_{2/2})_{d2}(R^1SiO_{3/2})_{t1}(HSiO_{3/2})_{t2}(SiO_{4/2})_{q1}$; wherein subscripts m1, m2, d1, d2, t1, t2, and q1 and functional group $R^1$ are independently as defined earlier. In some embodiments, Component (A) can be chosen from $(Me_3SiO_{1/2})_2(Me_2SiO_{2/2})_{1-2000}(HMeSiO_{2/2})_{1-2000}$, $(HMe_2SiO_{1/2})_{0.1-20}(SiO_{4/2})_{0.1-5}$ wherein the unit subscripts indicate mole ratios thereof, and $(HMe_2SiO_{1/2})_2(Me_2SiO_{2/2})_{1-2000}$. In some embodiments, Component (A) can be chosen from $(Me_3SiO_{1/2})_2(Me_2SiO_{2/2})_{3-4}(HMeSiO_{2/2})_{5-6}$, $(HMe_2SiO_{1/2})_{1-3}(SiO_{4/2})$ wherein the unit subscripts indicate mole ratios thereof, and $(HMe_2SiO_{1/2})_2(Me_2SiO_{2/2})_{100}$.

At each occurrence, $R^A$ can be independently selected from —H and —$R^1$. At least one $R^A$ in Component (A) can be —H, including a pendant Si—H, a terminal Si—H, or a combination thereof. At each occurrence $R^1$ can be independently a substituted or unsubstituted $(C_1\text{-}C_{20})$hydrocarbyl interrupted with 0, 1, 2, or 3 groups chosen from —O—, —S—, substituted or unsubstituted —NH—, —Si$((C_1\text{-}C_5)$alkoxy$)_2$-, and —Si$((C_1\text{-}C_5)$alkyl$)_2$-. The group $R^1$ can be a $(C_1\text{-}C_{20})$hydrocarbyl. The group $R^1$ can be a $(C_1\text{-}C_5)$alkyl. The group $R^1$ can be methyl.

Any suitable proportion of the precursor adhesive composition can be Component (B). In some embodiments, 0.1 wt % to 99.9 wt % of the precursor adhesive composition is Component (B), 10 wt % to 80 wt %, or 40 wt % to 99.9 wt %.

Component (B) can be non-linear. In various embodiments, Component (B) can be of the formula: $(R^B{}_3SiO_{1/2})_w(R^B{}_2SiO_{2/2})_x(R^BSiO_{3/2})_y(SiO_{4/2})_z$. The subscripts y and z can be independently 0 to 5,000, 0 to 2,000, 0 to 1,000, 0 to 500, 0 to 200, or 1 to 200. At least one of y and z is greater than 0. The subscript w is 0 to 500, 0 to 100, 0 to 50, 0 to 10, and subscript x is 0 to 5,000, 0 to 2,000, 0 to 1,000, 0 to 500, 0 to 200, or 1 to 200. The subscript n can be 1 to 1,000, or 1 to 100.

Component (B) can be of the formula $(ViMe_2SiO_{1/2})_w(Me_2SiO_{2/2})_x(SiO_{4/2})_z$, wherein subscript w is 0 to 500, 1 to 500, 1 to 100, 1 to 50, or 1 to 10, and subscripts x and z are independently 1 to 5,000, 1 to 2,000, 1 to 1,000, 1 to 500, or 1 to 150.

Component (B) can be of the formula $(ViMe_2SiO_{1/2})_{2-8}(Me_2SiO_{2/2})_{60-180}(SiO_{4/2})_{1-2}$ or $(ViMe_2SiO_{1/2})_{5-20}(Me_3SiO_{1/2})_{10-50}(SiO_{4/2})_{20-80}$. Component (B) can be of the formula $(ViMe_2SiO_{1/2})_4(Me_2SiO_{2/2})_{120}(SiO_{4/2})$ or $(ViMe_2SiO_{1/2})_{11}(Me_3SiO_{1/2})_{34}(SiO_{4/2})_{55}$.

In some embodiments, Component (B) can be linear. Component (B) can be of the formula: $(R^B{}_3SiO_{1/2})_2(R^B{}_2SiO_{2/2})_x$. The subscript x can be 0 to 5,000, 0 to 2,000, 0 to 1,000, 0 to 500, 0 to 200, or 1 to 200. In some embodiments, Component (B) is $(ViMe_2SiO_{1/2})_2(Me_2SiO_{2/2})_{50-300}$. In some embodiments, Component (B) is $(ViMe_2SiO_{1/2})_2(Me_2SiO_{2/2})_{150}$.

Component (B) can be chosen from $((R^2R^1{}_2SiO_{1/2})_2(Me_2SiO_{2/2})_{1-2000}$; alternatively from $(R^2R^1{}_2SiO_{1/2})_{m1}(R^1{}_3SiO_{1/2})_{m2}(R^2R^1SiO_{212})_{d1}(R^1{}_2SiO_{2/2})_{d2}(R^1SiO_{3/2})_{t1}(R^2SiO_{3/2})_{t2}(SiO_{4/2})_{q1}$, wherein subscripts m1, m2, d1, d2, t1, t2, and q1 and functional groups $R^1$ and $R^2$ are independently as defined earlier. Component (B) can be chosen from $(ViMe_2SiO_{1/2})_{1-100}(Me_2SiO_{2/2})_{50-200}(SiO_{4/2})_{1-5}$, $(ViMe_2SiO_{1/2})_2(Me_2SiO_{2/2})_{1-2000}$, and $(ViMe_2SiO_{1/2})_{1-800}(Me_3SiO_{1/2})_{1-2000}(SiO_{4/2})_{1-200}$. Component (B) can be chosen from $(ViMe_2SiO_{1/2})_4(Me_2SiO_{2/2})_{120}(SiO_{4/2})$, $(ViMe_2SiO_{1/2})_2(Me_2SiO_{2/2})_{150}$, and $(ViMe_2SiO_{1/2})_{11}(Me_3SiO_{1/2})_{34}(SiO_{4/2})_{55}$.

At each occurrence, $R^B$ can be independently selected from $R^1$ and $R^2$. At least one $R^B$ can be $R^2$, including a pendant Si—$R^2$, a terminal Si—$R^2$, or a combination thereof. At each occurrence $R^1$ can be independently a substituted or unsubstituted $(C_1\text{-}C_{20})$hydrocarbyl uninterrupted or interrupted with 1, 2, or 3 groups chosen from —O—, —S—, substituted or unsubstituted —NH—, —Si$((C_1\text{-}C_5)$alkoxy$)_2$-, and —Si$((C_1\text{-}C_5)$alkyl$)_2$-. The group $R^1$ can be a $(C_1\text{-}C_{20})$hydrocarbyl. The group $R^1$ can be a $(C_1\text{-}C_5)$alkyl. The group $R^1$ can be methyl. At each occurrence $R^2$ can be independently a substituted or unsubstituted $(C_2\text{-}C_{20})$alkenyl uninterrupted or interrupted with 1, 2, or 3 groups chosen from —O—, —S—, substituted or unsubstituted —NH—, —(O—$(C_2\text{-}C_3)$alkylene$)_n$- wherein n is 1 to 1,000, —Si$((C_1\text{-}C_5)$alkoxy$)_2$-, and —Si$((C_1\text{-}C_5)$alkyl$)_2$-. The group $R^2$ can be a $(C_2\text{-}C_{20})$alkenyl. The group $R^2$ can be a vinyl group.

In various embodiments, Component (A) can be a non-linear polysiloxane having an alkenyl group (e.g., branched polydimethylsiloxane). Component (A) can be a linear polysiloxane having alkenyl group (e.g., $M^{vi}D^{vi}DM^{vi}$, $MD^{vi}DM$). Component (A) can be a MQ vinyl siloxane ($M^{vi}Q$). Component (B) can be a linear ($MDD^HM^H$, $MDD^HM$) or non-linear ($M^HQ$) siloxane (unsubstituted). Component (B) can be a non-linear ($M^HQ$)siloxane (unsubstituted). Component (B) can be a linear or non-linear silicone chain-extender.

The precursor adhesive composition can have any suitable Si—H to alkenyl ratio (e.g., wherein the alkenyl group is a hydrosilylation-curable non-aromatic non-conjugated carbon-carbon double bond), such as 0.1:1 to 10:1, 0.7:1 to 2:1, or 0.1:1 or less, or 0.2:1. The Si—H to alkenyl ratio can be a ratio of Si—H groups in Component (A) to alkenyl groups in Component (B), or a ratio of Si—H groups to alkenyl groups in all the components of the precursor adhesive composition.

The precursor adhesive composition can have any suitable weight ratio of alkenyl-functional organopolysiloxane to hydrogenorganopolysiloxane, such as 0.001:1 to 1000:1, or 10:1 to 100:1, or 0.001:1 or less, or 0.01:1, with the proviso that the total amount of Components (A) and (B) is from 50 to <100 wt %, alternatively 50 to 99.9 wt %, alternatively 50 wt % to 99 wt %. The weight ratio of alkenyl-functional organopolysiloxane to hydrogenorganopolysiloxane can be a ratio of Component (B) to Component (A), or a ratio of all alkenyl-functional organopolysiloxanes in the precursor adhesive composition to all hydrogenorganopolysiloxane in the precursor adhesive composition.

The precursor adhesive composition, the adhesion promoter precursor composition, and the release layer precursor composition, can include any one or more optional components. Any one or more optional components described in this section can form any suitable proportion of the precursor adhesive composition, the adhesion promoter precursor composition, or the release layer precursor composition, such as 0.001 wt % to 90 wt %, 0.001 wt % to 50 wt %, or 0.01 wt % to 20 wt %.

In some embodiments, at least one of the precursor adhesive composition, the adhesion promoter precursor composition, and the release layer composition include at least one of a thermoplastic material, a thermoset material, a polymerizable monomer, a polymerizable or crosslinkable oligomer, a polymer, a crosslinkable polymer, a crosslinked polymer, a natural rubber or a synthetic rubber, a polyurethane, a polyisobutylene, a silane, an organosilane, a siloxane, an organosiloxane, a fluorosilicone, a fluorosilane, a shellac, a polyamide, a silyl-modified polyamide, a polyester, a polycarbonate, a polycarbamate, a urethane, a natural adhesive, an epoxy-based adhesive, a furan-based adhesive, a phenolic-based adhesive, an aldehyde-based adhesive, a urea-aldehyde adhesive, an acrylic acid-based adhesive, a phenol/phenol formaldehyde/furfuryl alcohol adhesive, a curing agent, a catalyst, a precursor that is curable to form of any one of the same, and a reaction product of any one of the same.

Examples of catalysts can include a hydrosilylation catalyst, a condensation catalyst, a free radical initiator, a photoinitiator, or an acid or base. Examples of hydrosilylation catalysts can include any suitable hydrosilylation catalyst, such as any hydrosilylation catalyst including a platinum group metal or a compound containing a platinum group metal. Platinum group metals can include platinum, rhodium, ruthenium, palladium, osmium and iridium. An example of a suitable hydrosilylation catalyst can include a platinum(IV) complex of 1,3-diethenyl-1,1,3,3-tetramethyldisiloxane. In another embodiment, the hydrosilylation catalyst can be a photoactivated hydrosilylation catalyst, or a hydrosilylation catalyst microencapsulated in a thermoplastic material.

Examples of curing agents can include at least one of an amine, an aromatic amine, an aliphatic amine, a cycloaliphatic amine, a polyamine, an amide, a polyamide, or an imine. Examples include a polyethyleneimine, piperidine, triethylamine, benzyldimethylamine, N,N-dimethylaminopyridine, 2-(N,N-dimethylaminomethypphenol, tris(dimethylaminomethyl)phenol, N-2-(aminoethyl)-3-aminopropyltrimethoxysilane, 3-glycidoxypropyltrimethoxysilane, n-beta-(aminoethyl)-gamma-aminopropyl trimethoxysilane, n-beta-(aminoethyl)-gamma-aminopropyl trimethoxysilane, piperazine, derivatives of piperazine (e.g., aminoethylpiperazine), pyrrole, imidazole, pyrazole, pyridine, pyrazine, pyrimidine, pyridazine, indolizine, isoindole, indole, indazole, purine, quinolizine, quinoline, isoquinoline, phthalazine, naphthyridine, quinoxaline, quinazoline, carbazole, carbazole, phenanthridine, acridine, phenathroline, phenazine, imidazolidine, phenoxazine, cinnoline, pyrrolidine, pyrroline, imidazoline, piperidine, indoline, isoindoline, quinuclindine, morpholine, azocine, azepine, 1,3,5-triazine, thiazole, pteridine, dihydroquinoline, hexamethyleneimine, indazole, 2-ethyl-4-methyl imidazole, 1,1,3-trichlorotrifluoroacetone, and combinations thereof.

In various embodiments, at least one of the precursor adhesive composition, the adhesion promoter precursor composition, and the release layer composition includes at least one of an organohydrogensilane, an organohydrogensiloxane, an organoalkenylsilane, and an organoalkenylsiloxane. In some embodiments, at least one of the precursor adhesive composition, the adhesion promoter precursor composition, and the release layer composition includes at least one of a non-linear $(C_2-C_{20})$alkenyl-functionalized organopolysiloxane, a linear $(C_2-C_{20})$alkenyl-functionalized organopolysiloxane, a linear $(C_2-C_{20})$alkenyl-functionalized fluoro$(C_1-C_{20})$alkyl-substituted organopolysiloxane, a non-linear hydrogenorganopolysiloxane, a linear hydrogenorganopolysiloxane, and a $((C_1-C_{20})$hydrocarbyphydrogensilsesquioxane, wherein the $(C_2-C_{20})$alkenyl group and $(C_1-C_{20})$hydrocarbyl are independently selected, substituted or unsubstituted, and are uninterrupted or interrupted by 1, 2, or 3 groups independently chosen from —O—, —S—, substituted or unsubstituted —NH—, —(O—$(C_2-C_3)$alkylene)$_n$- wherein n is 1 to 1,000, —Si(($C_1-C_5$)alkoxy)$_2$-, and —Si(($C_1-C_5$)alkyl)$_2$-.

At least one of the precursor adhesive composition, the adhesion promoter precursor composition, and the release layer composition can include at least one of a surfactant, emulsifier, dispersant, polymeric stabilizer, crosslinking agent, polymer, polymerization or crosslinking catalysts, rheology modifier, density modifier, aziridine stabilizers, cure modifier, free radical initiator, diluent, acid acceptor, antioxidant, heat stabilizer, flame retardant, scavenging agent, silylating agent, foam stabilizer, solvent, hydrosilylation-reactive diluent, plasticizer, filler, inorganic particle, pigment, dye, desiccants, liquid, a polyether having at least one alkenyl or akynyl group per molecule, thickening agent, stabilizing agent, wax, wax-like material, silicone, organofunctional siloxane, alkylmethylsiloxanes, siloxane resin, silicone gum, silicone carbinol fluid, water soluble or water dispersible silicone polyether composition, silicone rubber, hydrosilylation catalyst inhibitor, adhesion promoter, heat stabilizer, UV stabilizer, and a flow control additive.

In various embodiments is a display device processing intermediate. The display device processing intermediate can be any display device processing intermediate that can be made using any method described herein. The display device processing intermediate can include a carrier substrate, such as any carrier substrate described herein. The display device processing intermediate can include an adhesive delamination layer on the carrier substrate, such as any adhesive delamination layer described herein. The adhesive delamination layer can include a cured product of curing a precursor adhesive composition, such as a cured product of curing any precursor adhesive composition described herein. The display device processing intermediate can includes a display device substrate secured to the carrier substrate via the adhesive delamination layer. In various embodiments is a display device component or a display device formed from the display device processing intermediate.

In some embodiments is a display device processing intermediate 1 as illustrated in FIG. 1. The display device processing intermediate 1 includes a carrier substrate 10, such as any carrier substrate described herein. The display device processing intermediate 1 includes an adhesive delamination layer 30 on the carrier substrate 10, such as any adhesive delamination layer described herein. The adhesive delamination layer 30 includes a cured product of curing a precursor adhesive composition, such as a cured product of curing any precursor adhesive composition described herein. The display device processing intermediate 1 includes a display device substrate 50 secured to the carrier substrate 10 via the adhesive delamination layer 30. The adhesive delamination layer 30 can be directly on the carrier substrate 10 with no intervening layers. The display device substrate 50 can be directly on the adhesive delamination layer 30 with no intervening layers.

Figure 2:
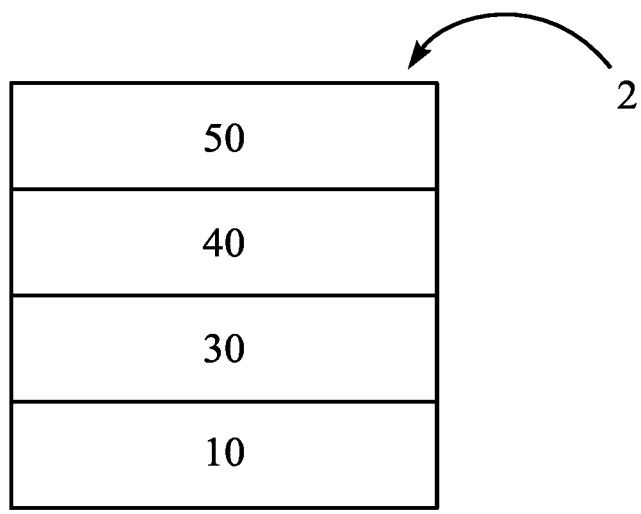
FIG. 2 illustrates a display device processing intermediate, in accordance with various embodiments.

In some embodiments is a display device processing intermediate 2 as illustrated in FIG. 2. The display device processing intermediate 2 includes an adhesive delamination layer 30 on the carrier substrate 10. The display device processing intermediate 2 includes a display device substrate 50 secured to the carrier substrate 10 via the adhesive delamination layer 30. The display device processing intermediate 2 includes a release layer 40 between the display device substrate 50 and the adhesive delamination layer 30. The release layer 40 can be directly on the display device substrate 50 with no intervening layers. The release layer 40 can be directly on the adhesive delamination layer 30 with no intervening layers. The adhesive delamination layer 30 can be directly on the carrier substrate 10 with no intervening layers.

Figure 3:
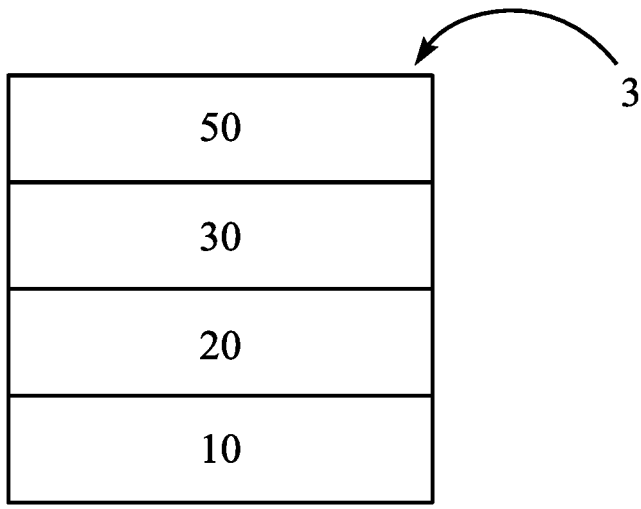
FIG. 3 illustrates a display device processing intermediate, in accordance with various embodiments.

In some embodiments is a display device processing intermediate 3 as illustrated in FIG. 3. The display device processing intermediate 3 includes an adhesive delamination layer 30 on the carrier substrate 10. The display device processing intermediate 3 includes a display device substrate 50 secured to the carrier substrate 10 via the adhesive delamination layer 30. The display device processing intermediate 3 includes an adhesion promoter layer 20 between the carrier substrate 10 and the adhesive delamination layer 30. The adhesion promoter layer 20 can be directly on the carrier substrate 10 with no intervening layers. The adhesion promoter layer 20 can be directly on the adhesive delamination layer 30 with no intervening layers. The display device substrate 50 can be directly on the adhesive delamination layer 30 with no intervening layers.

Figure 4:
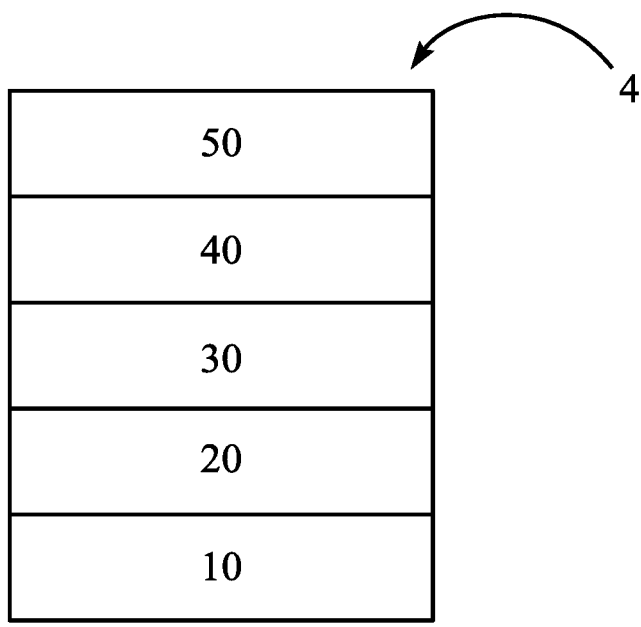
FIG. 4 illustrates a display device processing intermediate, in accordance with various embodiments.

In some embodiments is a display device processing intermediate 4 as illustrated in FIG. 4. The display device processing intermediate 4 includes an adhesive delamination layer 30 on the carrier substrate 10. The display device processing intermediate 4 includes a display device substrate 50 secured to the carrier substrate 10 via the adhesive delamination layer 30. The display device processing intermediate 4 includes an adhesion promoter layer 20 between the carrier substrate 10 and the adhesive delamination layer 30. The display device processing intermediate 4 includes a release layer 40 between the display device substrate 50 and the adhesive delamination layer 30. The adhesion promoter layer 20 can be directly on the carrier substrate 10 with no intervening layers. The adhesive delamination layer 30 can be directly on the adhesion promoter layer 20 with no intervening layers. The release layer 40 can be directly on the adhesive delamination layer 30 with no intervening layers. The display device substrate 50 can be directly on the release layer 40 with no intervening layers.

EXAMPLES

Various embodiments of the present invention can be better understood by reference to the following Examples which are offered by way of illustration. The present invention is not limited to the Examples given herein.

A glass substrate (Fisherbrand® Microscope slide with a dimension of 75 mm×50 mm and thickness of 1.0 mm (Fisher Scientific, Loughborough, UK)) was cleaned by detergent and prepared as a carrier for these Examples.

Peel strength testing. Peel strength was measured by a TMI adhesion tester (Testing Machines, Inc., Del., USA) with a peeling rate of 12 inches per minute at room temperature. Laminate structures were affixed to the stage of the adhesion tester using double sided tape, with an adhesion force with glass significantly greater than the maximum peel force of the laminate structures. 3M™ 471 tape (3M Company) with 50 mm width was applied to the release layer in order to create a tail to affix to the clamps of the TMI adhesion tester. The tail created was of length 50 mm to 75 mm extension beyond the release layer edge. The instrument was set up for 90° peel testing. The tape tail was then affixed to the clamps, and the instrument was zeroed. Once zeroed, the test was initiated using the control software. Measurement of peeling force was performed via a force transducer, and with the output given on a computer monitor. Once complete, the maximum peel force was recorded, and the sample was removed. The reported peel strength is an average measurement from at least 3 samples.

Example 1

Silicone adhesive cured with branched alkenyl siloxane and linear crosslinker. A siloxane solution was formed with non-linear alkenyl organosiloxane $((ViMe_2SiO_{1/2})_4(Me_2SiO_{2/2})_{120}(SiO_{4/2}))$ having a dynamic viscosity measured at 25° C. of 100-600 centipoise (cp) and linear hydrogenorganosiloxane $(((Me_3SiO_{1/2})_2(Me_2SiO_{2/2})_{3-4}(HMeSiO_{2/2})_{5-6})$ with Si—H/vinyl ratio of 1.5:1, a Pt catalyst, and diallyl maleate inhibitor, with inhibitor/catalyst ratio of 150:1. This siloxane solution was spin coated on the carrier glass with thickness 10-100 μm, and then cured at 160° C. for 2 minutes. A slim glass (Fisherbrand® Microscope cover glass with dimension of 50 mm×45 mm and 0.13 mm to 0.17 mm thickness) was then laminated on top of the cured silicone on the carrier. The assembly was placed under vacuum at around $10^{-3}$ Torr (0.13 pascal) for 1 hour to achieve close adhesion, and then was put in a preheated air circulated oven at 250° C. for 1.5 hours. No outgassing was observed. The slim glass was released from the silicone on the carrier with a 90 degree peel force of 45 g/cm.

Example 2

Silicone adhesive cured with linear alkenyl siloxane and branched crosslinker. A siloxane solution was formed with linear alkenyl organosiloxane $((ViMe_2SiO_{1/2})_2(Me_2SiO_{2/2})_{150})$ and branched hydrogenorganosiloxane $((HMe_2SiO_{1/2})_{1.58}(SiO_{4/2})$ wherein the unit subscripts indicate mole ratios thereof, an oligomer) with Si—H/vinyl ratio of 1.5:1, a Pt catalyst, and diallyl maleate inhibitor with inhibitor/catalyst ratio of 150:1. This siloxane solution was spin coated on the carrier glass with thickness 10-100 μm, and then cured at 160° C. for 2 minutes. A slim glass (Fisherbrand® Microscope cover glass with dimension of 50 mm×45 mm and 0.13 mm to 0.17 mm thickness) was then laminated on top of the cured silicone on the carrier. The assembly was placed under vacuum at around $10^{-3}$ Torr (0.13 pascal) for 1 hour to achieve closely adhesion, and then was put in a preheated air circulated oven at 250° C. for 1.5 hours. No outgassing was observed. The slim glass was released from the silicone on the carrier with a 90 degree peel force of 34 g/cm.

Example 3

Silicone adhesive cured with branched alkenyl siloxane and branched crosslinker. A siloxane solution was formed with branched alkenyl organosiloxane $((ViMe_2SiO_{1/2})_4(Me_2SiO_{2/2})_{120}(SiO_{4/2}))$ having a dynamic viscosity of 100-600 cp measured at 25° C. and branched hydrogenorganosiloxane $((HMe_2SiO_{1/2})_{1.58}(SiO_{4/2})$ wherein the unit subscripts indicate mole ratios thereof, an oligomer) with Si—H/vinyl ratio of 1.5:1, a Pt catalyst, and diallyl maleate inhibitor with inhibitor/catalyst ratio of 150:1. This siloxane solution was spin coated on the carrier glass with thickness 10-100 μm, and then cured at 160° C. for 2 minutes. A slim glass (Fisherbrand® Microscope cover glass with dimension of 50 mm×45 mm and 0.13 mm to 0.17 mm thickness) was then laminated on top of the cured silicone on the carrier. The assembly was placed under vacuum at around $10^{-3}$ Torr (0.13 pascal) for 1 hour to achieve closely adhesion, and then was put in a preheated air circulated vacuum oven at 250° C. for 1.5 hours. No outgassing was observed. The slim glass was released from the silicone on the carrier with a 90 degree peel force of 55 g/cm.

Example 4

Silicone adhesive cured with branched alkenyl siloxane and branched crosslinker, with a release layer coating. A siloxane solution was formed with branched alkenyl organosiloxane $((ViMe_2SiO_{1/2})_4(Me_2SiO_{2/2})_{120}(SiO_{4/2}))$ having a dynamic viscosity measured at 25° C. of 100-600 cp and a branched hydrogenorganosiloxane $((HMe_2SiO_{1/2})_{1.58}(SiO_{4/2})$ wherein the unit subscripts indicate mole ratios thereof, an oligomer) with Si—H/vinyl ratio of 1.5:1, a Pt catalyst, and diallyl maleate inhibitor with inhibitor/catalyst ratio of 150:1. This siloxane solution was spin coated on the carrier glass with thickness 10-100 μm, and then cured at 160° C. for 2 minutes.

A phenyl silsesquioxane solution $((HSiO_{3/2})_{0.01-0.5}(C_6H_5SiO_{3/2})_{1-0.5}$ wherein the unit subscripts indicate mole ratios thereof, wherein the silsesquioxane is a solid at room temperature when not dissolved in organic solvent and has a molecular weight of 200 g/mol to 100,000 g/mol) was spin coated on a slim glass with dimension of 50 mm×45 mm and 0.13 mm to 0.17 mm thickness, and then was soft baked at 160° C. for 2 minutes. This coated slim glass was then laminated on top of the cured silicone on the carrier. The assembly was placed under vacuum at around $10^{-3}$ Torr (0.13 pascal) for 1 hour to achieve close adhesion, and then was put in a preheated vacuum oven at 250° C. for 1.5 hours. No out gassing was observed. The slim glass was released from silicone on the carrier with a 90 degree peel force of 19 g/cm.

Example 5

Silicone adhesive cured with branched alkenyl siloxane and linear crosslinker, with a release layer coating. A siloxane solution was formed with branched alkenyl organosiloxane $((ViMe_2SiO_{1/2})_4(Me_2SiO_{2/2})_{120}(SiO_{4/2}))$ having a dynamic viscosity measured at 25° C. of 100-600 cp and linear hydrogenorganosiloxane $(((Me_3SiO_{1/2})_2(Me_2SiO_{2/2})_{3-4}(HMeSiO_{2/2})_{5-6})$ with Si—H/vinyl ratio of 1.5:1, a Pt catalyst, and diallyl maleate inhibitor with inhibitor/catalyst ratio of 150:1. This siloxane solution was spin coated on the carrier glass with thickness 10-100 μm, and then cured at 160° C. for 2 minutes.

A phenyl silsesquioxane solution $((HSiO_{3/2})_{0.01-0.5}(C_6H_5SiO_{3/2})_{1-0.5}$ wherein the unit subscripts indicate mole ratios thereof, wherein the silsesquioxane is a solid at room temperature when not dissolved in organic solvent and has a molecular weight of 200 g/mol to 100,000 g/mol) was spin coated on a slim glass with dimension of 50 mm×45 mm and 0.13 mm to 0.17 mm thickness, and then was soft baked at 160° C. for 2 minutes. This coated slim glass was then laminated on top of the cured silicone on the carrier. The assembly was placed under vacuum at around $10^{-3}$ Torr (0.13 pascal) for 1 hour to achieve close adhesion, and then was put in a preheated vacuum oven at 300° C. for 1 hours. No out gassing was observed. The slim glass was released from silicone on the carrier with a 90 degree peel force of 19 g/cm.

Example 6

Silicone adhesive cured with linear alkenyl siloxane and branched crosslinker, with a release layer coating. A siloxane solution was formed with alkenyl organosiloxane $((ViMe_2SiO_{1/2})_2(Me_2SiO_{2/2})_{150})$ and branched hydrogenorganosiloxane $((HMe_2SiO_{1/2})_{1.55}(SiO_{4/2})$ wherein the unit subscripts indicate mole ratios thereof, an oligomer) with Si—H/vinyl ratio of 1.5:1, a Pt catalyst, and diallyl maleate inhibitor with inhibitor/catalyst ratio of 150:1. This siloxane solution was spin coated on the carrier glass with thickness 10-100 μm, and then cured at 160° C. for 2 minutes.

A phenyl silsesquioxane solution $((HSiO_{3/2})_{0.01-0.5}(C_6H_5SiO_{3/2})_{1-0.5}$ wherein the unit subscripts indicate mole ratios thereof, wherein the silsesquioxane is a solid at room temperature when not dissolved in organic solvent and has a molecular weight of 200 g/mol to 100,000 g/mol) was spin coated on a slim glass with dimension of 50 mm×45 mm and 0.13 mm to 0.17 mm thickness, and then was soft baked at 160° C. for 2 minutes. This coated slim glass was then laminated on top of the cured silicone on the carrier. The assembly was placed under vacuum at around $10^{-3}$ Torr (0.13 pascal) for 1 hour to achieve close adhesion, and then was put in a preheated oven at 250° C. for 1.5 hours. No out gassing was observed. The slim glass was released from silicone on the carrier with a 90 degree peel force of 28 g/cm.

Example 7

Silicone adhesive cured with MQ alkenyl siloxane and chain extender. A siloxane solution was formed with branched polyvinylorganosiloxane $((ViMe_2SiO_{1/2})_{11}(Me_3SiO_{1/2})_{34}(SiO_{4/2})_{55})$ and a hydrogenorganosiloxane $((HMe_2SiO_{1/2})_2(Me_2SiO_{2/2})_{100}$ wherein the unit subscripts indicate mole ratios thereof) with Si—H/vinyl ratio of 1.5:1, a Pt catalyst, and diallyl maleate inhibitor with inhibitor/catalyst ratio of 150:1. This siloxane solution was spin coated on the carrier glass with thickness 10-100 μm, and then cured at 160° C. for 2 minutes. A slim glass (Fisherbrand® Microscope cover glass with dimension of 50 mm×45 mm and 0.13 mm to 0.17 mm thickness) was then laminated on top of the cured silicone on the carrier. The assembly was placed under vacuum at around $10^{-3}$ Torr (0.13 pascal) for 1 hour to achieve close adhesion, and then was put in a preheated air circulated oven at 250° C. for 1.5 hours. No outgassing was observed. The slim glass was released from silicone on the carrier with a 90 degree peel force of 55 g/cm.

Example 8

Silicone as adhesive delamination layer with polyimide film. A siloxane solution was formed with alkenyl organosiloxane $((ViMe_2SiO_{1/2})_2(Me_2SiO)_{150})$ and branched hydrogenorganosiloxane $((HMe_2SiO_{1/2})_{1.58}(SiO_{4/2})$ wherein the unit subscripts indicate mole ratios thereof, an oligomer) with Si—H/vinyl ratio of 1.8:1, a Pt catalyst, and diallyl maleate inhibitor with inhibitor/catalyst ratio of 150:1. Then Pt catalyst and diallyl maleate inhibitors were added, with an inhibitor/catalyst ratio of 50-200.

A 25 μm-thick Upilex®-S polyimide (PI) film (UBE Industries, Ltd., Tokyo, Japan) was cleaned with isopropyl alcohol, then dried in oven under 150° C. for 30 minutes prior to use.

The siloxane adhesive solution was spin coated on the carrier glass with thickness around 10-150 μm depending on the spin rate; and then cured at 160° C. for 2 minutes. After cooling to room temperature, a 1 inch wide and 2 inch long section of the PI film was laminated onto the adhesive layer-coated carrier. The laminate was then heated on a preheated 180° C. hot plate for 20 minutes. No outgassing was observed. The PI film could be easily peeled off the carrier with clean surface and low peel force. The measured 90 degree peel force was around 6 g/cm.

Example 9

Silicone as adhesive delamination layer with polyimide film. A siloxane adhesive solution was prepared by mixing vinyl functionalized polydimethylsiloxane (($ViMe_2SiO_{1/2}$)$_2$ ($Me_2SiO$)$_{600}$) and vinyl functional MQ resin (($ViMe_2SiO_{1/2}$)$_{11}$($Me_3SiO_{1/2}$)$_{34}$($SiO_{4/2}$)$_{55}$) with Si—H functionalized polysiloxane (($Me_3SiO_{1/2}$)$_2$($Me_2SiO$)$_{3-4}$($HMeSiO$)$_{5-6}$) with Si—H/vinyl ratio of 0.75-2. Then Pt catalyst and diallyl maleate inhibitors were added, with an inhibitor/catalyst ratio of 50-200.

A 25 μm-thick Upilex®-S polyimide (PI) film purchased from UBE was cleaned with isopropyl alcohol, then dried in oven under 150° C. for 30 minutes prior to use.

The siloxane adhesive solution was spin coated on the carrier glass with thickness around 10-150 μm depending on the spin rate; and then cured at 160° C. for 2 minutes. After cooling to room temperature, a 1 inch wide and 2 inch long section of the PI film was laminated onto the adhesive layer-coated carrier. The laminate was then heated on a preheated 180° C. hot plate for 20 minutes. No outgassing was observed. The PI film could be easily peeled off the carrier with clean surface and low peel force. The measured 90 degree peel force was around 9 g/cm.

Example 10

Silicone as adhesive delamination layer with polyimide film for high temperature application. A siloxane adhesive solution was prepared by mixing vinyl functionalized polydimethylsiloxane (($ViMe_2SiO_{1/2}$)$_2$($Me_2SiO$)$_{600}$) and vinyl functional MQ resin (($ViMe_2SiO_{1/2}$)$_{11}$($Me_3SiO_{1/2}$)$_{34}$($SiO_{4/2}$)$_{55}$) with Si—H functionalized polysiloxane (($Me_3SiO_{1/2}$)($Me_2SiO$)$_{3-4}$($HMeSiO$)$_{5-6}$($O_{1/2}SiMe_3$)) with Si—H/vinyl ratio of 0.75-2. Then Pt catalyst and diallyl maleate inhibitors were added, with an inhibitor/catalyst ratio of 50-200. After that 1000 ppm of $Ce(OSiMe_2(OSiMe_3)_2)_4$ was added to the formulation and well mixed.

A 25 μm-thick Upilex®-S polyimide (PI) film purchased from UBE was cleaned with isopropyl alcohol, then dried in oven under 150° C. for 30 minutes prior to use.

The siloxane adhesive solution was spin coated on the carrier glass with thickness around 10-150 μm depending on the spin rate; and then cured at 120° C. for 1 minutes. After cooling to room temperature, a 1 inch wide and 2 inch long section of the PI film was laminated onto the adhesive layer-coated carrier. The laminate was then heated on a preheated 380° C. hot plate for 30 minutes. No outgassing was observed. The PI film could be easily peeled off the carrier with clean surface and low peel force.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

The claims which follow are incorporated as numbered aspects here by reference. The numbered aspects are identical to the claims except the words "claim" and "claims" have been replaced by the words "aspect" and "aspects", respectively.

What is claimed is:

1. A method of processing a display device substrate, the method comprising the step of:
   securing the display device substrate to a carrier substrate with an adhesive delamination layer comprising a cured product of curing a precursor adhesive composition comprising:
   Component (A), a hydrogenorganopolysiloxane; and
   Component (B), a ($C_2$-$C_{20}$) alkenyl-functionalized organopolysiloxane, wherein the ($C_2$-$C_{20}$) alkenyl group is uninterrupted or interrupted by 1, 2, or 3 groups independently chosen from —O—, —S—, substituted or unsubstituted —NH—, —(O—($C_2$-$C_3$)alkylene)$_n$- wherein n is 1 to 1,000, —Si(($C_1$-$C_5$)alkoxy)$_2$-, and —Si(($C_1$-$C_5$)alkyl)$_2$-;
   wherein at least one of Component (A) and Component (B) is non-linear and wherein the securing provides a display device processing intermediate wherein an adhesion promoter layer is between the carrier substrate and the adhesive delamination layer and/or a release layer is between the adhesive delamination layer and the display device substrate.

2. The method of claim 1, wherein Component (A) is non-linear and Component (B) is linear; or wherein Component (A) is linear and Component (B) is non-linear.

3. The method of claim 1, wherein Component (A) is non-linear and Component (A) is of formula:

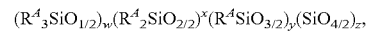

wherein
at each occurrence, $R^A$ is independently selected from —H and —$R^1$,
at least one $R^A$ in Component (A) is —H,
at each occurrence $R^1$ is independently a substituted or unsubstituted ($C_1$-$C_{20}$) hydrocarbyl interrupted with 0, 1, 2, or 3 groups chosen from —O—, —S—, substituted or unsubstituted —NH—, —Si(($C_1$-$C_5$)alkoxy)$_2$-, and —Si(($C_1$-$C_5$)alkyl)$_2$-,
y and z are independently 0 to 5,000,
at least one of y and z is greater than 0,
w is 0 to 500, and
x is 0 to 5,000.

4. The method of claim 1, wherein Component (A) is linear and Component (A) is of formula:

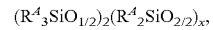

wherein
at each occurrence, $R^A$ is independently selected from —H and —$R^1$,
at least one $R^A$ in Component (A) is —H,
at each occurrence $R^1$ is independently a substituted or unsubstituted ($C_1$-$C_{20}$)hydrocarbyl interrupted with 0, 1, 2, or 3 groups chosen from —O—, —S—, substituted or unsubstituted —NH—, —Si(($C_1$-$C_5$)alkoxy)$_2$-, and —Si(($C_1$-$C_5$)alkyl)$_2$-, and
x is 0 to 5,000.

5. The method of claim 1, wherein Component (B) is non-linear and Component (B) is of formula:

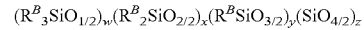

wherein at each occurrence, $R^B$ is independently selected from $R^1$ and $R^2$, at least one $R^B$ is $R^2$, at each occurrence $R^1$ is independently a substituted or unsubstituted $(C_1-C_{20})$hydrocarbyl interrupted with 0, 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, at each occurrence $R^2$ is independently a substituted or unsubstituted $(C_2-C_{20})$alkenyl interrupted with 0, 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-, y and z are independently 0 to 5,000, at least one of y and z is greater than 0, w is 0 to 500, and x is 0 to 5,000.

6. The method of claim 1, wherein Component (B) is linear and Component (B) is of formula:

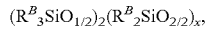

$(R^B{}_3SiO_{1/2})_2(R^B{}_2SiO_{2/2})_x$, wherein at each occurrence, $R^B$ is independently selected from —$R^1$ and —$R^2$, at least one $R^B$ is $R^2$, at each occurrence $R^1$ is independently a substituted or unsubstituted $(C_1-C_{20})$ hydrocarbyl interrupted with 0, 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, at each occurrence $R^2$ is independently a substituted or unsubstituted $(C_2-C_{20})$ alkenyl interrupted with 0, 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-, and x is 0 to 5,000.

7. The method of claim 1, wherein Component (A) is chosen from $(HR^1{}_2SiO_{1/2})_2(R^1{}_2SiO_{2/2})_{1-2000}$ and $(HR^1{}_2SiO_{1/2})_{m1}(R^1{}_3SiO_{1/2})_{m2}(HR^1SiO_{2/2})_{d1}(R^1{}_2SiO_{2/2})_{d2}(R^1SiO_{3/2})_{t1}(HSiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, m2 is from 0 to 0.8, d1 is from 0 to 0.999, d2 is from 0 to 0.9999, t1 is from 0 to 0.8, t2 is from 0 to 0.8, and q1 is from 0 to 0.99, and wherein at each occurrence $R^1$ is independently a substituted or unsubstituted $(C_1-C_{20})$hydrocarbyl interrupted with 0, 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-.

8. The method of claim 1, wherein Component (B) is chosen from $(R^2R^1{}_2SiO_{1/2})_2(Me_2SiO_{2/2})_{1-2000}$ and $(R^2R^1{}_2SiO_{1/2})_{m1}(R^1{}_3SiO_{1/2})_{m2}(R^2R^1SiO_{2/2})_{d1}(R^1{}_2SiO_{2/2})_{d2}(R^1SiO_{3/2})_{t1}(R^2SiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, m2 is from 0 to 0.8, d1 is from 0 to 0.9999, d2 is from 0 to 0.9999, t1 is from 0 to 0.8, t2 is from 0 to 0.8, and q1 is from 0 to 0.99, and wherein at each occurrence $R^1$ is independently a substituted or unsubstituted $(C_1-C_{20})$hydrocarbyl interrupted with 0, 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, and at each occurrence $R^2$ is independently a substituted or unsubstituted $(C_2-C_{20})$alkenyl interrupted with 0, 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-.

9. The method of claim 1, wherein:

Component (A) is of formula: $(Me_3SiO_{1/2})_2(Me_2SiO_{2/2})_{1-6}(HMeSiO_{2/2})_{3-9}$, and Component (B) is of formula: $(ViMe_2SiO_{1/2})_{2-8}(Me_2SiO_{2/2})_{50-200}(SiO_{4/2})_{1-2}$; or Component (A) is of formula: $(Me_3SiO_{1/2})_2(Me_2SiO_{2/2})_{3-4}(HMeSiO_{2/2})_{5-6}$, and Component (B) is of formula: $(ViMe_2SiO_{1/2})_4(Me_2SiO_{2/2})_{120}(SiO_{4/2})$; or Component (A) is of formula: $(HMe_2SiO_{1/2})_{1-3}(SiO_{4/2})$ wherein the unit subscripts indicate mole ratios thereof, and Component (B) is of formula: $(ViMe_2SiO_{1/2})_2(Me_2SiO_{2/2})_{50-300}$; or Component (A) is of formula: $(HMe_2SiO_{1/2})_{1.58}(SiO_{4/2})$ wherein the unit subscripts indicate mole ratios thereof, and Component (B) is of formula: $(ViMe_2SiO_{1/2})_2(Me_2SiO_{2/2})_{150}$; or Component (A) is of formula: $(HMe_2SiO_{1/2})_2(Me_2SiO_{2/2})_{50-300}$, and Component (B) is of formula: $(ViMe_2SiO_{1/2})_{5-20}(Me_3SiO_{1/2})_{10-50}(SiO_{4/2})_{20-80}$; or Component (A) is of formula: $(HMe_2SiO_{1/2})_2(Me_2SiO_{2/2})_{100}$, and Component (B) is of formula: $(ViMe_2SiO_{1/2})_{11}(Me_3SiO_{1/2})_{34}(SiO_{4/2})_{55}$.

10. The method of claim 1, wherein the precursor adhesive composition further comprises at least one of a silane, an organosilane, a siloxane, an organosiloxane, silicone carbinol fluid, a rubber, a polyurethane, a polyisobutylene, a polyamide, a silyl-modified polyamide, a polyester, a polycarbonate, a polycarbamate, a polyether having at least one alkenyl or akynyl group per molecule, water soluble or water dispersible silicone polyether composition, wax, wax-like material, shellac, a urethane, a precursor that is curable to form of any one of the foregoing, a curing agent and/or a catalyst to cure said precursor when said precursor is present, and a reaction product of any one of the foregoing.

11. The method of claim 1, wherein the precursor adhesive composition further comprises at least one of a natural adhesive, an epoxy-based adhesive, a furan-based adhesive, a phenolic-based adhesive, an aldehyde-based adhesive, a urea-aldehyde adhesive, an acrylic acid-based adhesive, a phenol/phenol formaldehyde/furfuryl alcohol adhesive, adhesion promoter, a surfactant, emulsifier, foam stabilizer, dispersant, crosslinking agent, rheology modifier, density modifier, cure modifier, hydrosilylation catalyst inhibitor, free radical initiator, acid acceptor, antioxidant, UV stabilizer, aziridine stabilizers, heat stabilizer, flame retardant, scavenging agent, silylating agent, diluent, solvent, plasticizer, thickening agent, filler, inorganic particle, pigment, dye, desiccants, and a flow control additive.

12. The method of claim 1, further comprising at least one of the steps of: (a) washing, drying, forming a film, applying a liquid photoresist, exposure to light, development, etching, resist removal, sealing, vapor deposition, adhesion treatment, heating, annealing, irradiating, cooling the display device substrate, and at least one of the steps of (b) placing, forming and modifying on the display device substrate at least one of a semiconductor material, a semiconductor device, a diode, a light emitting diode, a transistor, a transistor array, a capacitor, a conductive pathway, a circuit pattern, a gate line, a data line, an electrical connector, an electrode, a transparent electrode, an electrical insulator, an electrically insulating layer, a protective layer, a color filter, a liquid crystal, a hole injection layer, a hole transporting layer, a light emitting layer, a passivation layer, an electrophoretic film, and an electron transporting layer.

13. The method of claim 1, further comprising removing the display device substrate from the carrier substrate.

14. A method of processing a display device substrate, the method comprising:
   securing the display device substrate to a carrier substrate with an adhesive delamination layer comprising a cured product of curing a precursor adhesive composition comprising:
   0.1 wt % to 99 wt % Component (A), wherein Component (A) is a hydrogenorganopolysiloxane chosen from $(HR^1_2SiO_{1/2})_2(R^1_2SiO_{2/2})_{1-2000}$ and $(HR^1_2SiO_{1/2})_{m1}(R^1_3SiO_{1/2})_{m2}(HR^1SiO_{2/2})_{d1}(R^1_2SiO_{2/2})_{d2}(R^1SiO_{3/2})_{t1}(HSiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, m2 is from 0 to 0.8, d1 is from 0 to 0.999, d2 is from 0 to 0.9999, t1 is from 0 to 0.8, t2 is from 0 to 0.8, and q1 is from 0 to 0.99; and
   0.1 wt % to 99.9 wt % Component (B), wherein Component (B) is an alkenyl-functionalized organopolysiloxane chosen from $(R^2R^1_2SiO_{1/2})_2(Me_2SiO_{2/2})_{1-2000}$ and $(R^2R^1_2SiO_{1/2})_{m1}(R^1_3SiO_{1/2})_{m2}(R^2R^1SiO_{2/2})_{d1}(R^1_2SiO_{2/2})_{d2}(R^1SiO_{3/2})_{t1}(R^2SiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, m2 is from 0 to 0.8, d1 is from 0 to 0.9999, d2 is from 0 to 0.9999, t1 is from 0 to 0.8, t2 is from 0 to 0.8, and q1 is from 0 to 0.99;
   wherein
   at least one of Component (A) and Component (B) is non-linear,
   at each occurrence in Component (A) and (B) $R^1$ is independently a substituted or unsubstituted $(C_1-C_{20})$ hydrocarbyl interrupted with 0, 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, and
   at each occurrence in Component (B), $R^2$ is independently a substituted or unsubstituted $(C_2-C_{20})$alkenyl interrupted with 0, 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-;
   and wherein the securing provides a display device processing intermediate wherein an adhesion promoter layer is between the carrier substrate and the adhesive delamination layer and/or a release layer is between the adhesive delamination layer and the display device substrate.

15. A display device processing intermediate comprising:
   a carrier substrate;
   an adhesive delamination layer on the carrier substrate comprising a cured product of curing a precursor adhesive composition comprising
   Component (A), a hydrogenorganopolysiloxane; and
   Component (B), a $(C_2-C_{20})$alkenyl-functionalized organopolysiloxane, wherein the $(C_2-C_{20})$alkenyl group is uninterrupted or interrupted by 1, 2, or 3 groups independently chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-;
   wherein at least one of Component (A) and Component (B) is non-linear; and
   a display device substrate secured to the carrier substrate via the adhesive delamination layer;
   and wherein the display device processing intermediate has an adhesion promoter layer between the carrier substrate and the adhesive delamination layer and/or a release layer between the adhesive delamination layer and the display device substrate.

16. The display device processing intermediate according to claim 15,
   wherein the precursor adhesive composition comprises
   0.1 wt % to 99 wt % Component (A), wherein Component (A) is a hydrogenorganopolysiloxane chosen from $(HR^1_2SiO_{1/2})_2(R^1_2SiO_{2/2})_{1-2000}$ and $(HR^1_2SiO_{1/2})_{m1}(R^1_3SiO_{1/2})_{m2}(HR^1SiO_{2/2})_{d1}(R^1_2SiO_{2/2})_{d2}(R^1SiO_{3/2})_{t1}(HSiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, m2 is from 0 to 0.8, d1 is from 0 to 0.999, d2 is from 0 to 0.9999, t1 is from 0 to 0.8, t2 is from 0 to 0.8, and q1 is from 0 to 0.99; and
   0.1 wt % to 99.9 wt % Component (B), wherein Component (B) is an alkenyl-functionalized organopolysiloxane chosen from $(R^2R^1_2SiO_{1/2})^2(Me_2SiO_{2/2})_{1-2000}$ and $(R^2R^1_2SiO_{1/2})_{m1}(R^1_3SiO_{1/2})_{m2}(R^2R^1SiO_{2/2})_{d1}(R^1_2SiO_{2/2})_{d2}(R^1SiO_{3/2})_{t1}(R^2SiO_{3/2})_{t2}(SiO_{4/2})_{q1}$, wherein subscripts m1, m2, d1, d2, t1, t2, and q1 represent mole fractions of their respective repeat units such that the sum of m1+m2+d1+d2+t1+t2+q1=1; wherein m1 is from 0 to 0.8, m2 is from 0 to 0.8, d1 is from 0 to 0.9999, d2 is from to 0.9999, t1 is from 0 to 0.8, t2 is from 0 to 0.8, and q1 is from 0 to 0.99;
   wherein
   at least one of Component (A) and Component (B) is non-linear,
   at each occurrence in Component (A) and (B), $R^1$ is independently a substituted or unsubstituted $(C_1-C_{20})$ hydrocarbyl interrupted with 0, 1, 2, or 3 groups chosen from —O—, —S—, substituted or unsubstituted —NH—, —Si$((C_1-C_5)$alkoxy$)_2$-, and —Si$((C_1-C_5)$alkyl$)_2$-, and
   at each occurrence in Component (B), $R^2$ is independently a substituted or unsubstituted $(C_2-C_{20})$alkenyl interrupted with 0, 1, 2, or 3 groups chosen from —O—, —S—, substituted or unsubstituted —NH—, —(O—$(C_2-C_3)$alkylene$)_n$- wherein n is 1 to 1,000, —Si$((C_1-C_5)$alkoxy$)_2$-, and —Si$((C_1-C_5)$alkyl$)_2$-; and
   a display device substrate secured to the carrier substrate via the adhesive delamination layer.

17. The method of claim 1, wherein the precursor adhesive composition further comprises at least one of a thermoplastic material, a thermoset material, and a crosslinkable polymer.

* * * * *